(12) United States Patent
Tay

(10) Patent No.: US 8,582,004 B2
(45) Date of Patent: Nov. 12, 2013

(54) NOISE-CANCELLING IMAGE SENSORS

(71) Applicant: Hiok Nam Tay, Singapore (SG)

(72) Inventor: Hiok Nam Tay, Singapore (SG)

( * ) Notice: Subject to any disclaimer, the term of this patent is extended or adjusted under 35 U.S.C. 154(b) by 0 days.

(21) Appl. No.: 13/845,158

(22) Filed: Mar. 18, 2013

(65) Prior Publication Data

US 2013/0222653 A1 Aug. 29, 2013

Related U.S. Application Data

(63) Continuation of application No. 12/639,941, filed on Dec. 16, 2009, now Pat. No. 8,451,348.

(60) Provisional application No. 61/138,085, filed on Dec. 16, 2008, provisional application No. 61/257,825, filed on Nov. 3, 2009.

(51) Int. Cl.
*H04N 5/335* (2011.01)
*H04N 5/217* (2011.01)

(52) U.S. Cl.
USPC .......................................... 348/241; 348/308

(58) Field of Classification Search
USPC .................. 348/241–251, 294–308
See application file for complete search history.

(56) References Cited

U.S. PATENT DOCUMENTS

| | | | | |
|---|---|---|---|---|
| 6,795,117 B2 * | 9/2004 | Tay | | 348/241 |
| 6,885,396 B1 * | 4/2005 | Panicacci et al. | | 348/241 |
| 7,245,321 B2 * | 7/2007 | Panicacci et al. | | 348/241 |
| 7,282,685 B2 * | 10/2007 | Boemler | | 250/208.1 |
| 7,612,817 B2 * | 11/2009 | Tay | | 348/308 |
| 7,697,051 B2 * | 4/2010 | Krymski | | 348/308 |
| 7,995,127 B2 * | 8/2011 | Koizumi et al. | | 348/308 |
| 8,026,961 B2 * | 9/2011 | Takenaka et al. | | 348/241 |
| 8,081,250 B2 * | 12/2011 | Hiyama et al. | | 348/308 |
| 8,310,569 B2 * | 11/2012 | Willassen | | 348/245 |
| 2002/0180875 A1 * | 12/2002 | Guidash | | 348/280 |
| 2002/0190215 A1 * | 12/2002 | Tashiro et al. | | 250/370.11 |
| 2003/0189209 A2 * | 10/2003 | Tay | | 257/72 |
| 2004/0233312 A1 * | 11/2004 | Tay | | 348/308 |
| 2006/0066741 A1 * | 3/2006 | Koizumi et al. | | 348/308 |
| 2008/0006764 A1 * | 1/2008 | Boemler | | 250/208.1 |
| 2009/0059044 A1 * | 3/2009 | Tay | | 348/294 |
| 2009/0166515 A1 * | 7/2009 | Boemler | | 250/208.1 |
| 2009/0237544 A1 * | 9/2009 | Hiyama et al. | | 348/308 |
| 2009/0295974 A1 * | 12/2009 | Koizumi et al. | | 348/311 |
| 2010/0053392 A1 * | 3/2010 | Sawada et al. | | 348/294 |
| 2011/0013045 A1 * | 1/2011 | Tay | | 348/222.1 |

* cited by examiner

*Primary Examiner* — Sinh Tran
*Assistant Examiner* — Selam Gebriel

(57) ABSTRACT

An image sensor that has a plurality of pixels within a pixel array coupled to a control circuit and to one or more subtraction circuits. The control circuit may cause an output transistor coupled to a pixel to provide a first reference output signal, a common reset output signal, and a first sense-node reset output signal, between which a subtraction circuit may form a weighted difference to create a noise signal. The control circuit may cause the output transistor to provide a second sense-node reset output signal, a light response output signal and a second reference output signal, between which a subtraction circuit may form a weighted difference to create a normalized light response signal. The light response output signal corresponds to the image that is to be captured by the sensor. The noise signal may be subtracted from the normalized light response signal to generate a de-noised signal.

2 Claims, 33 Drawing Sheets

3rd noise & normalizing methods:

Mixed 3rd noise method, 2nd normalizing method:

Mixed 3rd noise method & 1st normalizing method:

2nd noise & normalizing methods, 2nd ref diff. from 1st ref.

2nd noise & normalizing methods, 4th embodiment.

3rd noise & normalizing methods, 4th embodiment.

NOISE-CANCELLING IMAGE SENSORS

CROSS-REFERENCE TO RELATED APPLICATIONS

This application is a continuation of U.S. patent application Ser. No. 12/639,941, filed on Dec. 16, 2009, which claims priority to U.S. Provisional Patent Application No. 61/138,085 filed on Dec. 16, 2008 and U.S. Provisional Patent Application No. 61/257,825 filed on Nov. 3, 2009.

BACKGROUND OF THE INVENTION

1. Field of the Invention

The subject matter disclosed generally relates to solid state image sensors.

2. Background Information

Photographic equipment such as digital cameras and digital camcorders may contain electronic image sensors that capture light for processing into still or video images. Electronic image sensors typically contain millions of light capturing elements such as photodiodes.

Solid state image sensors can be either of the charge coupled device (CCD) type or the complimentary metal oxide semiconductor (CMOS) type. In either type of image sensor, photo sensors are supported by a substrate and arranged in a two-dimensional array. Image sensors typically contain millions of pixels to provide a high-resolution image.

BRIEF SUMMARY OF THE INVENTION

An image sensor that has a plurality of pixels within a pixel array coupled to a control circuit and to one or more subtraction circuits. The control circuit may cause an output transistor coupled to a pixel to provide a first reference output signal, a common reset output signal, and a first sense-node reset output signal, between which a subtraction circuit may form a weighted difference to create a noise signal. The control circuit may cause the output transistor to provide a second sense-node reset output signal, a light response output signal and a second reference output signal, between which a subtraction circuit may form a weighted difference to create a normalized light response signal. The light response output signal corresponds to the image that is to be captured by the sensor. The noise signal may be subtracted from the normalized light response signal to generate a de-noised signal.

BRIEF DESCRIPTIONS OF THE DRAWINGS

Figure 3:
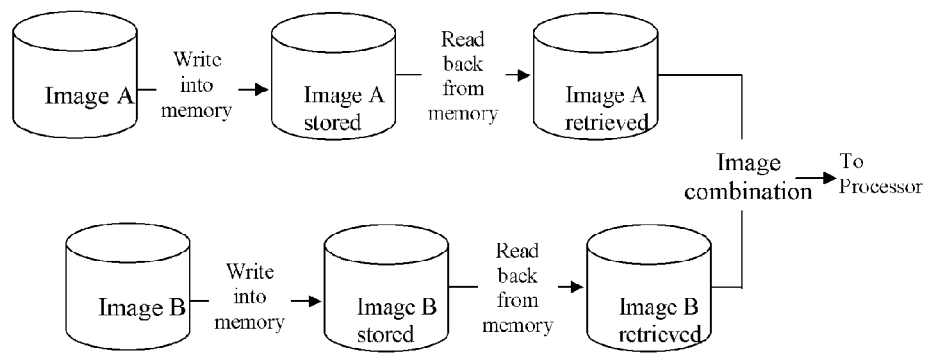
Figure 4:
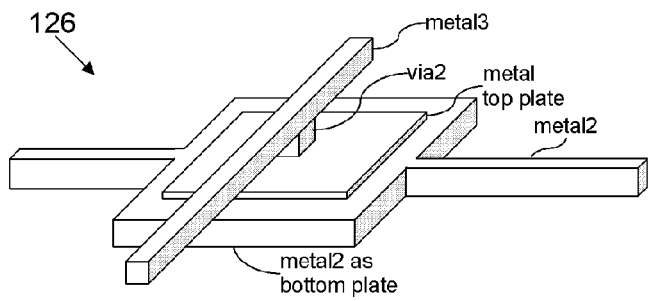
Figure 13:
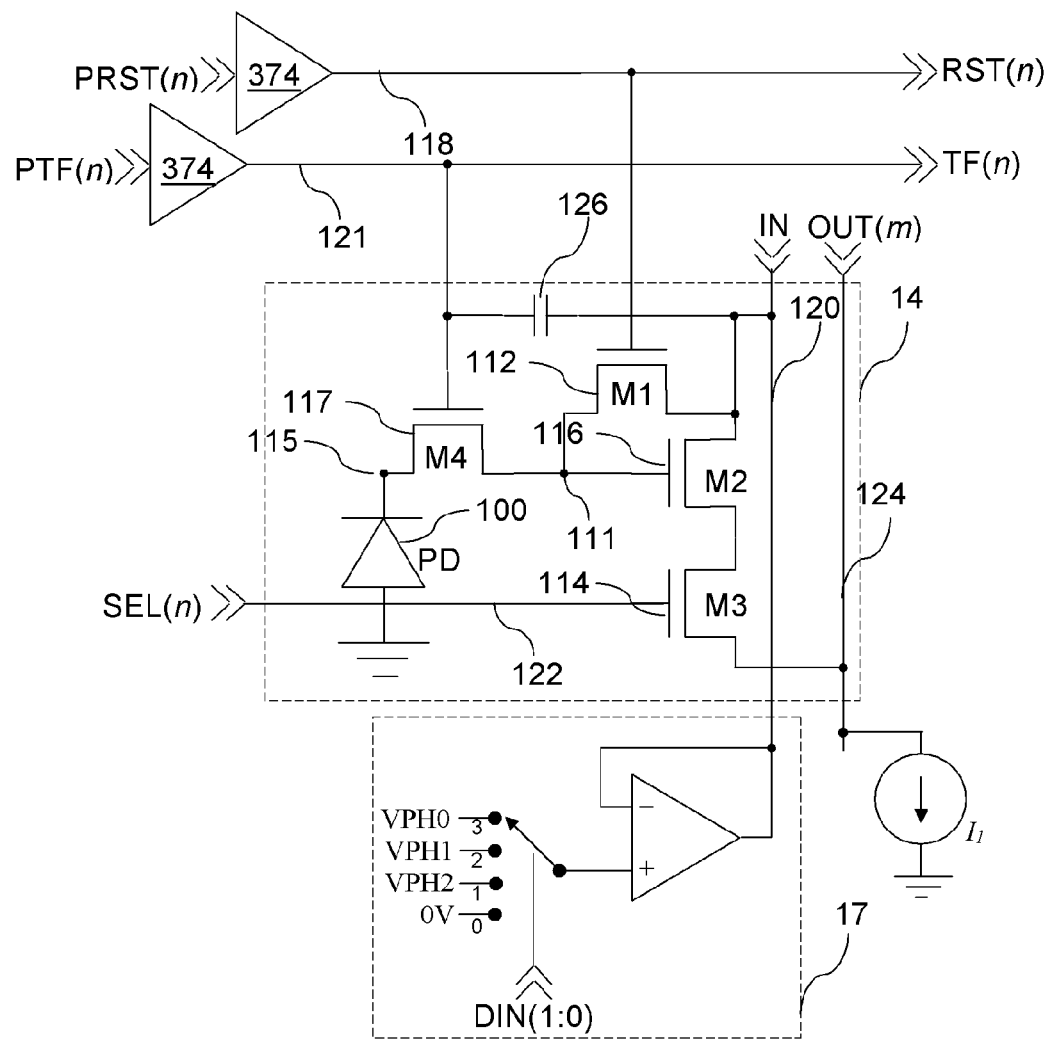

FIG. 3 an illustration of a method for retrieving and combining pixel data for an image;

FIG. 4 is an illustration of a capacitor in the pixel circuit of FIG. 13.

Figure 5:
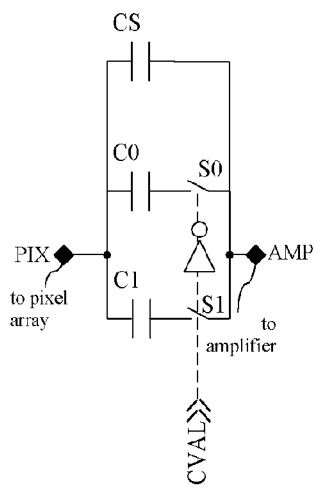
Figure 6:
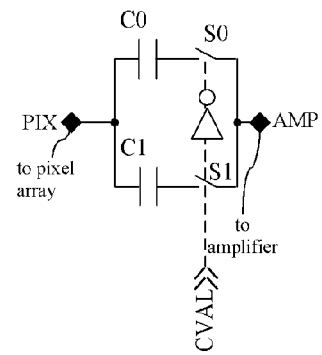
Figure 7:
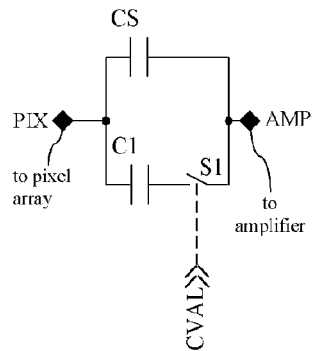
Figure 8:
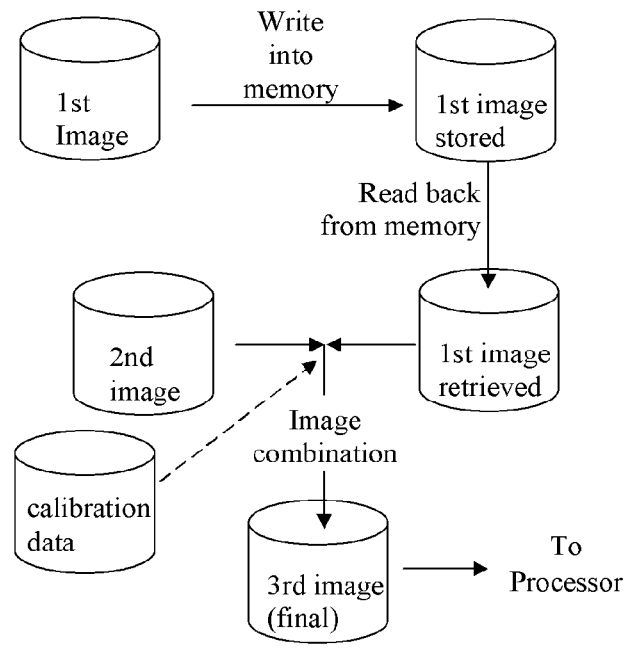
Figure 9:
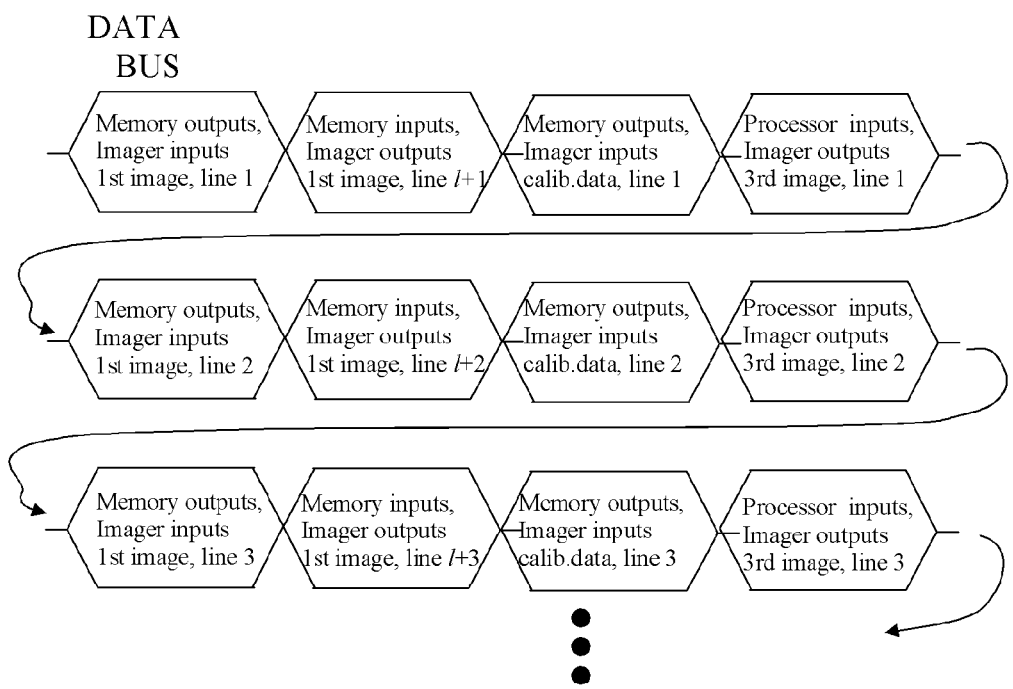
Figure 10:
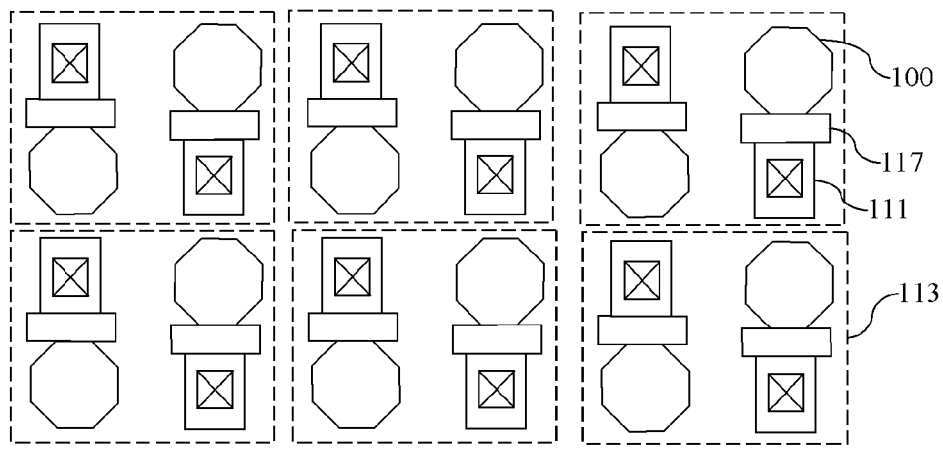
Figure 11:
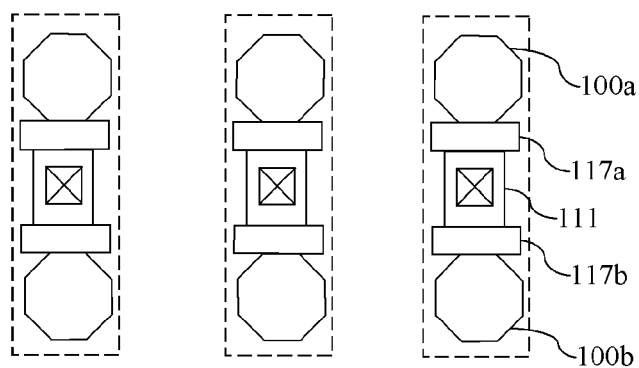
Figure 11:
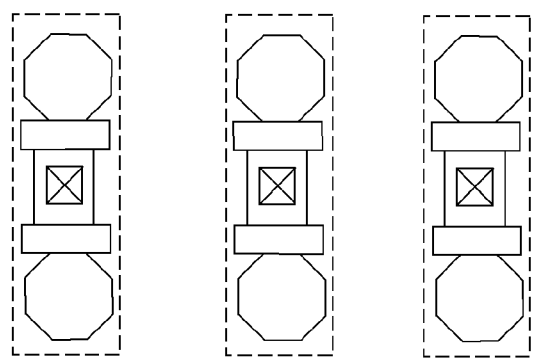
Figure 12:
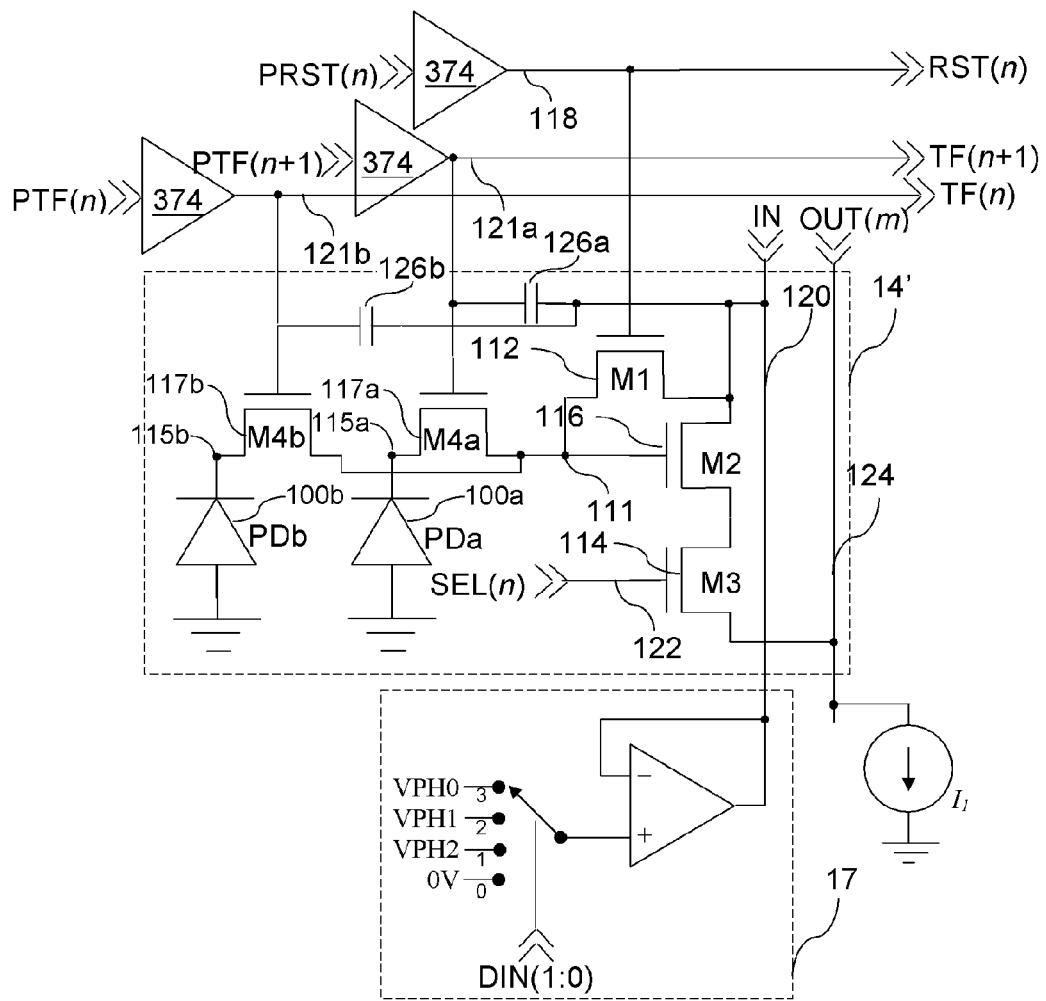
Figure 14A:
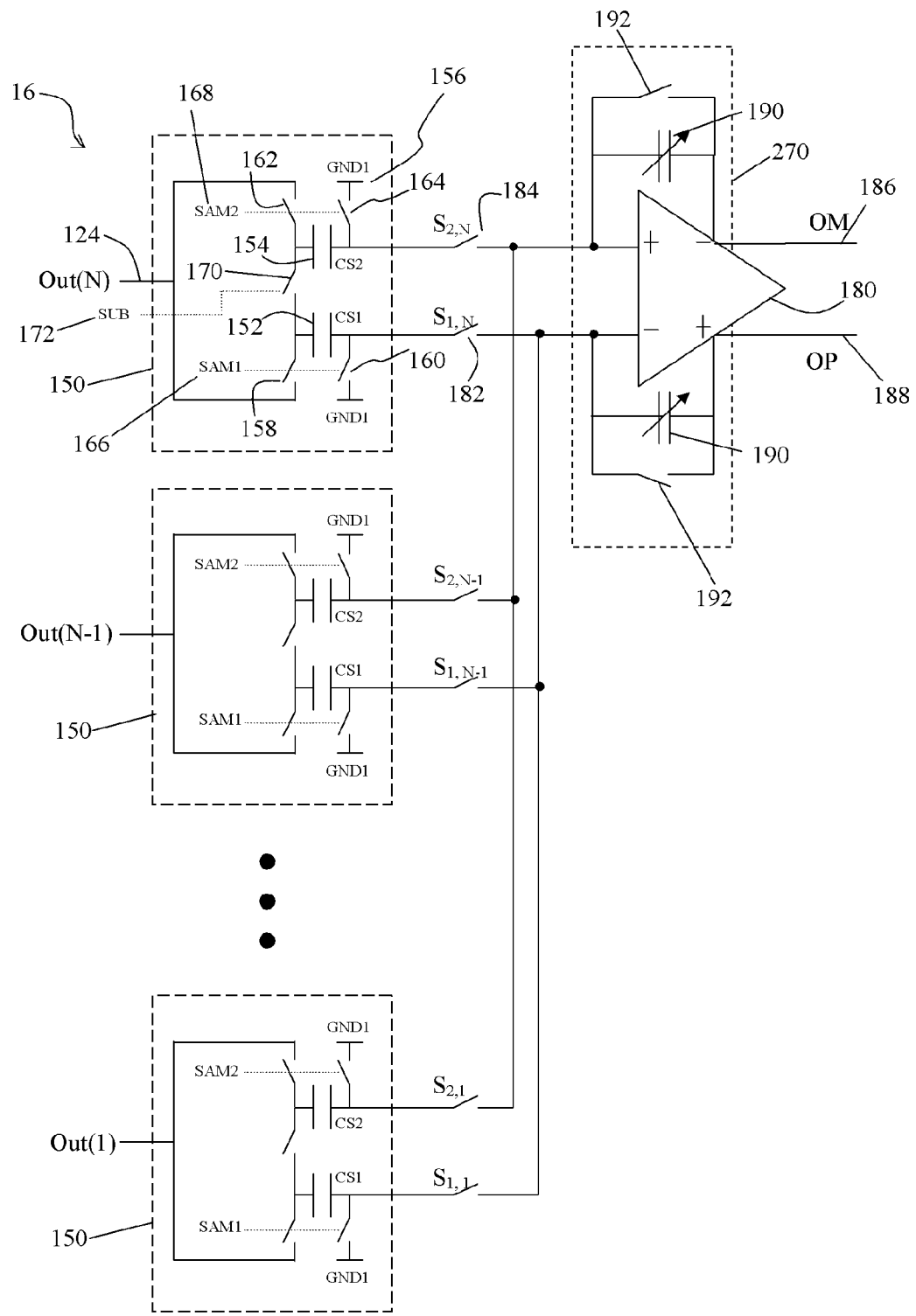
Figure 14B:
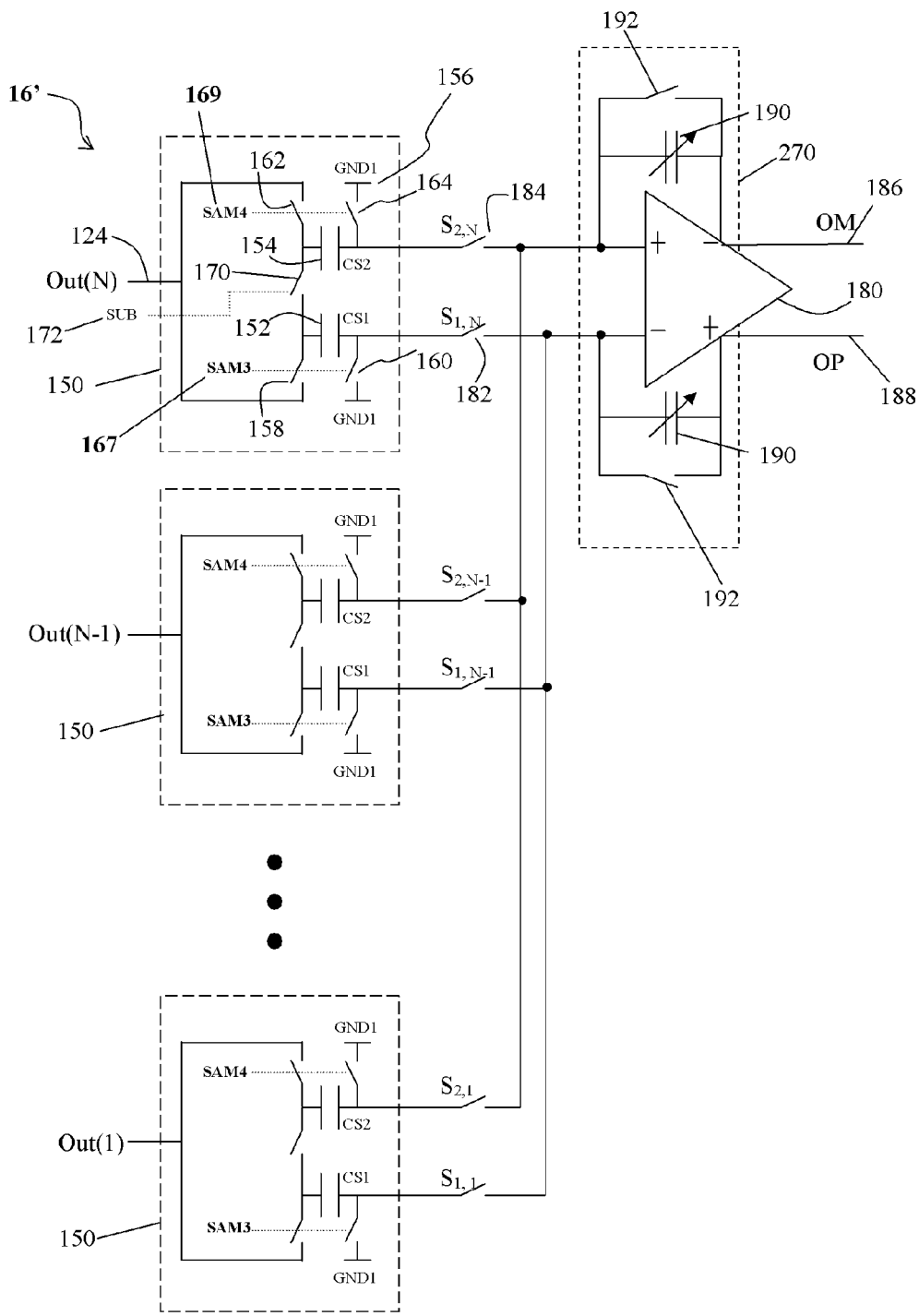
Figure 14C:
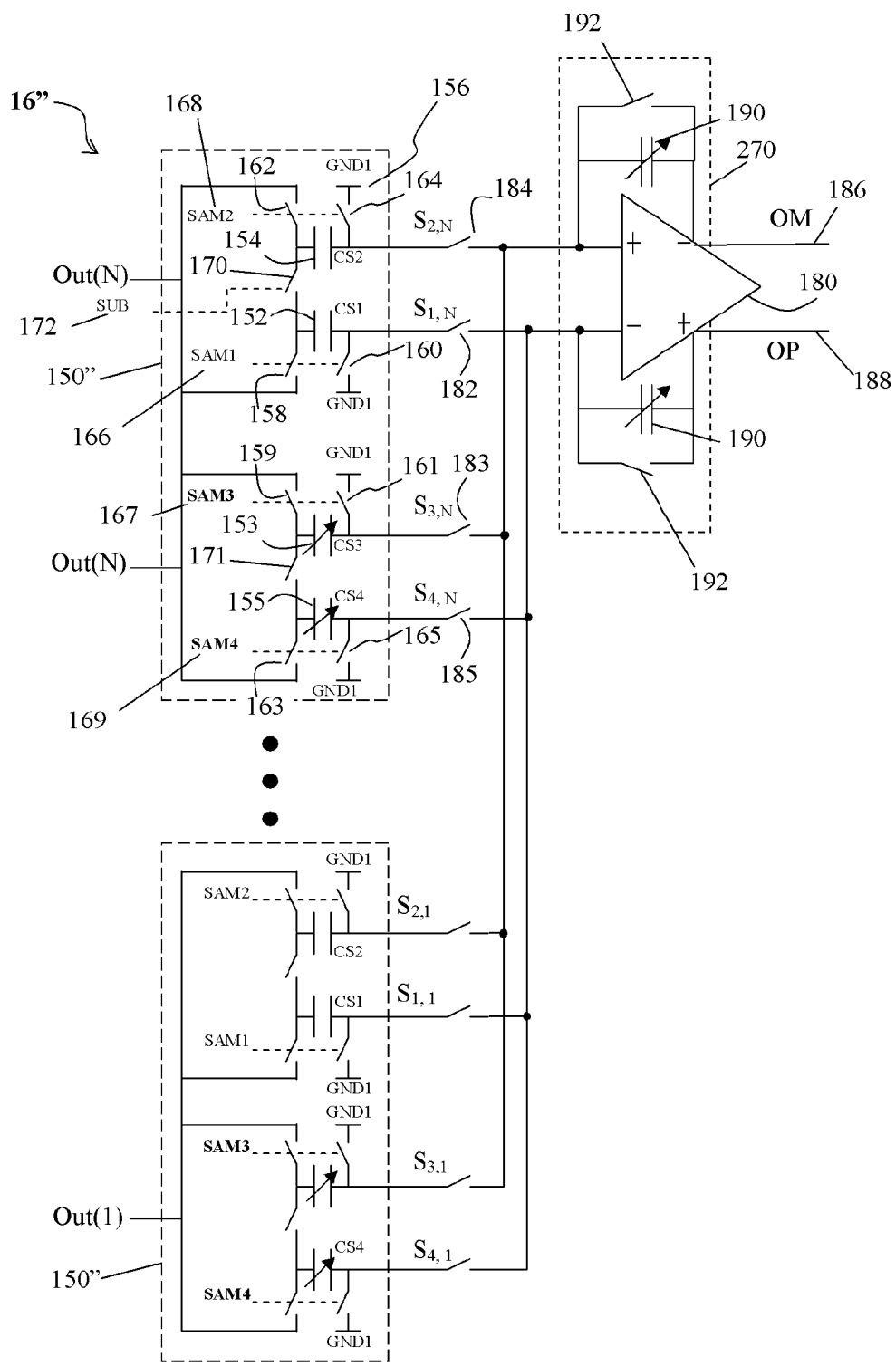
Figure 15A:
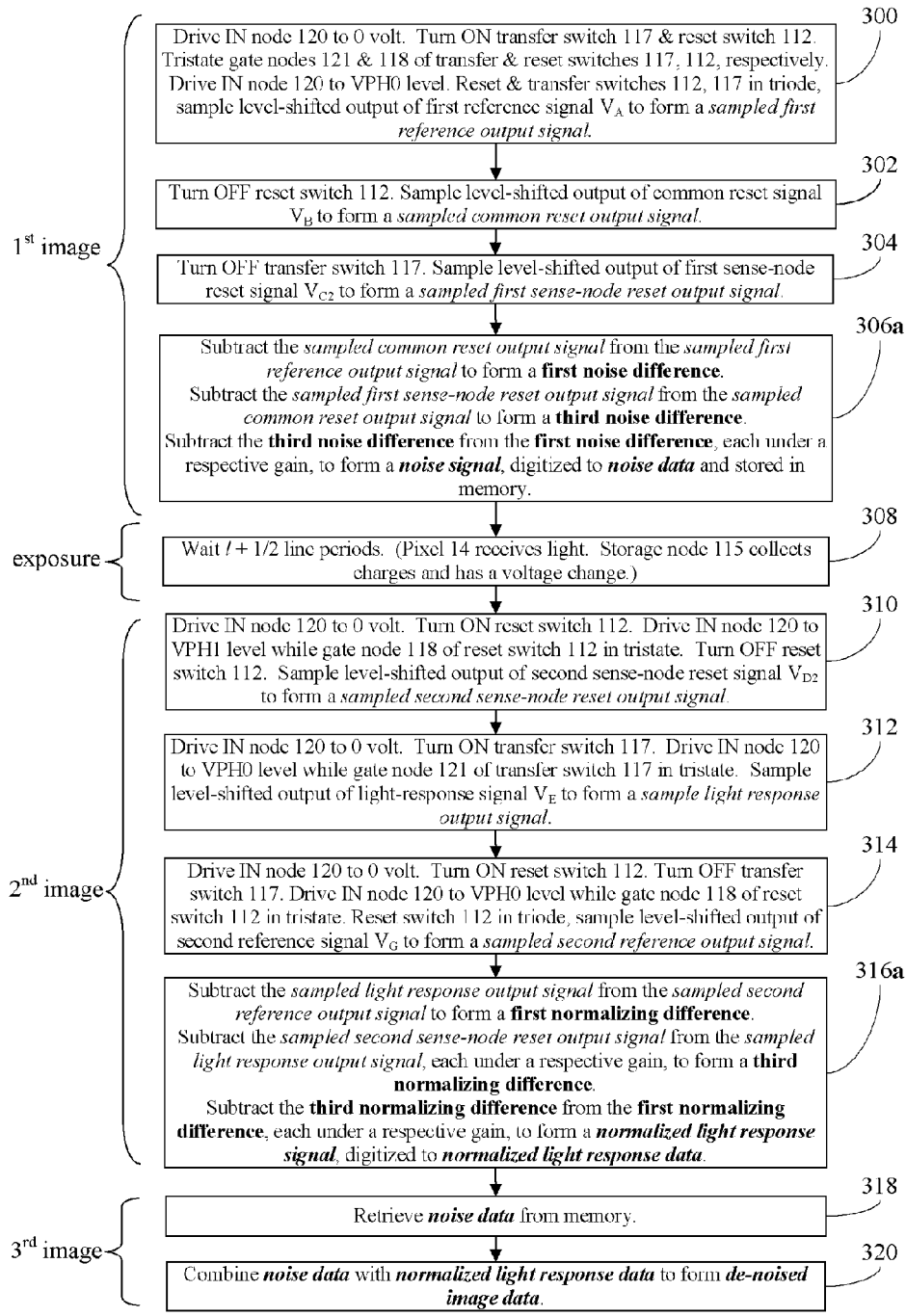
Figure 15B:
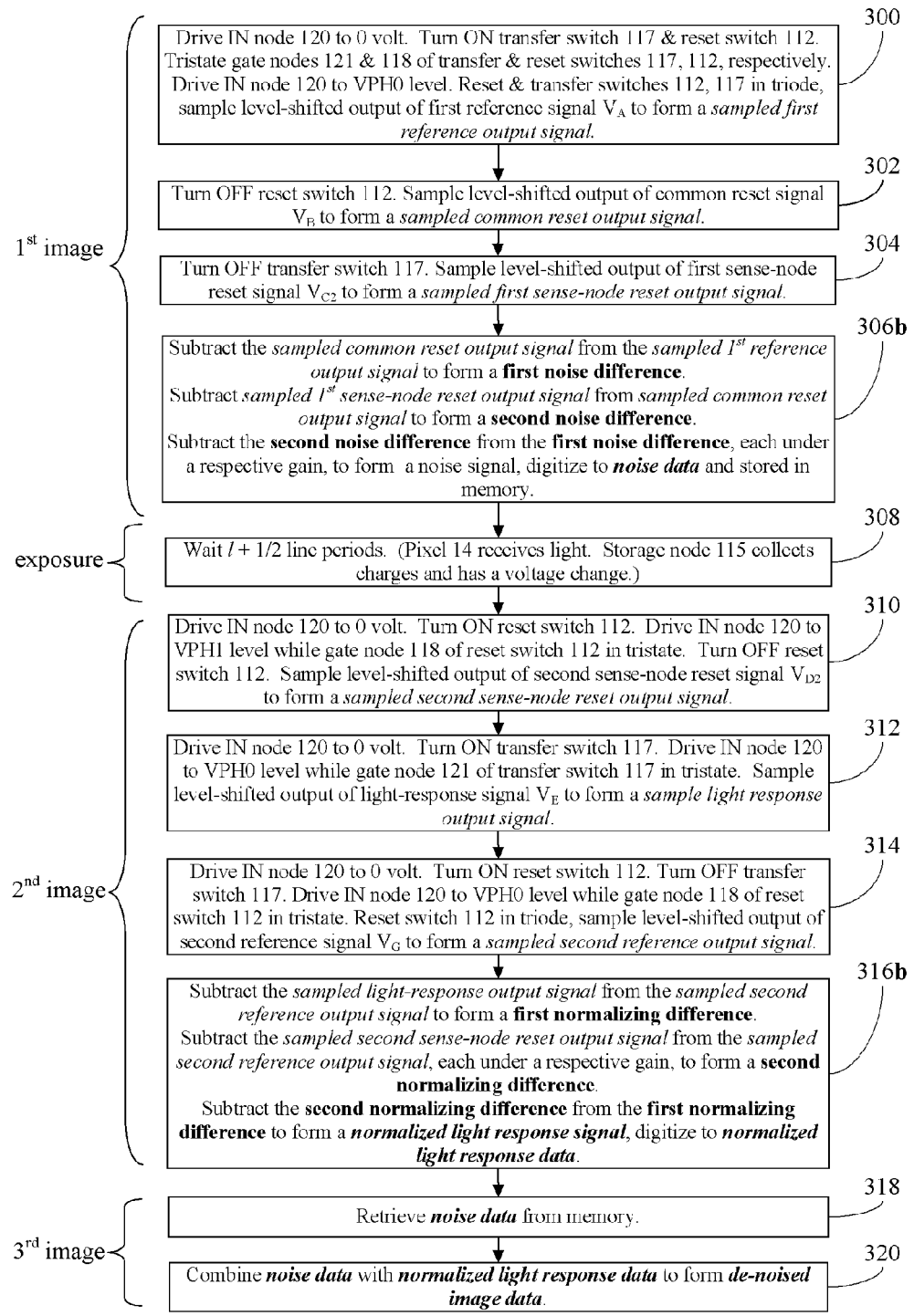
Figure 15C:
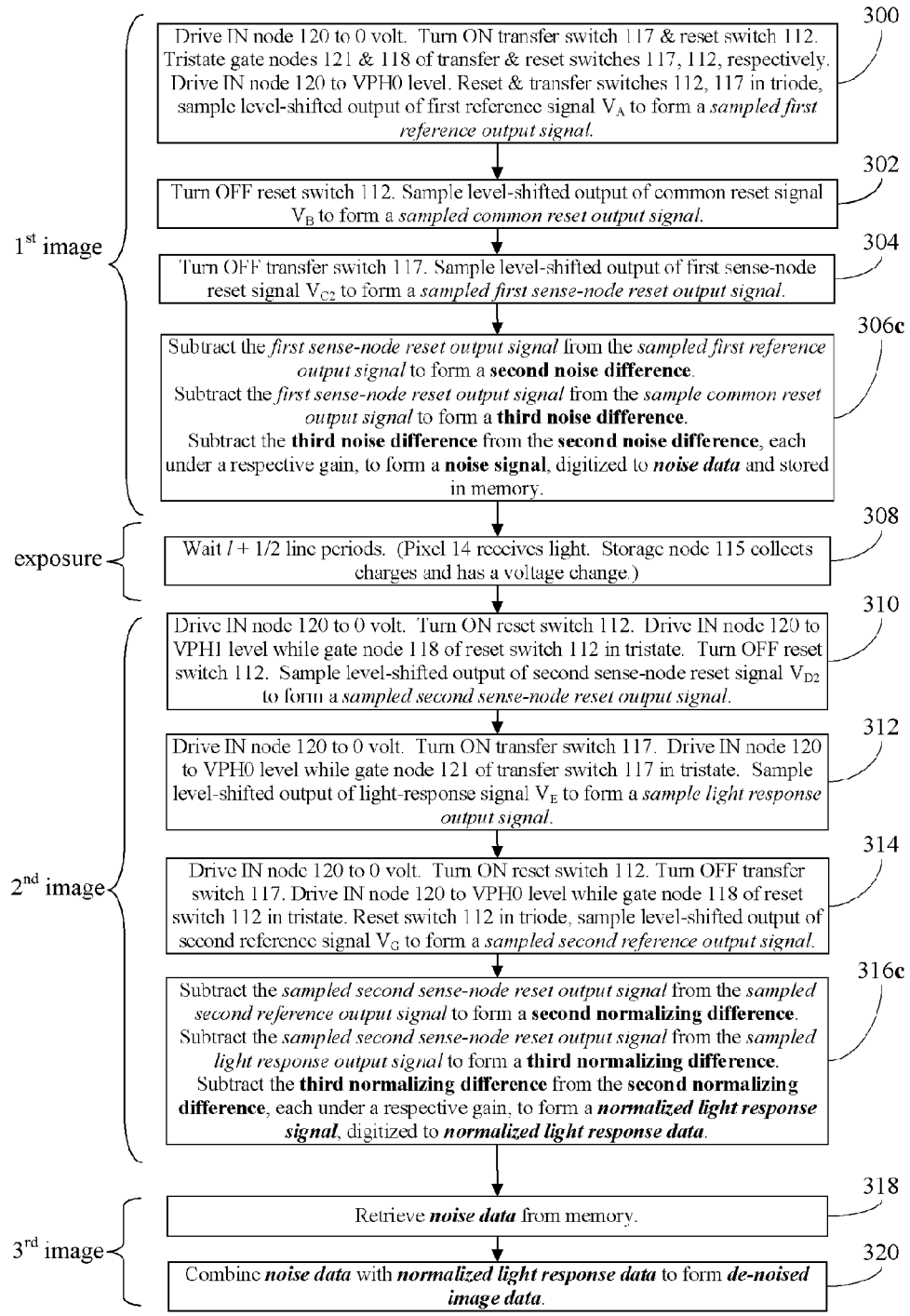
Figure 15D:
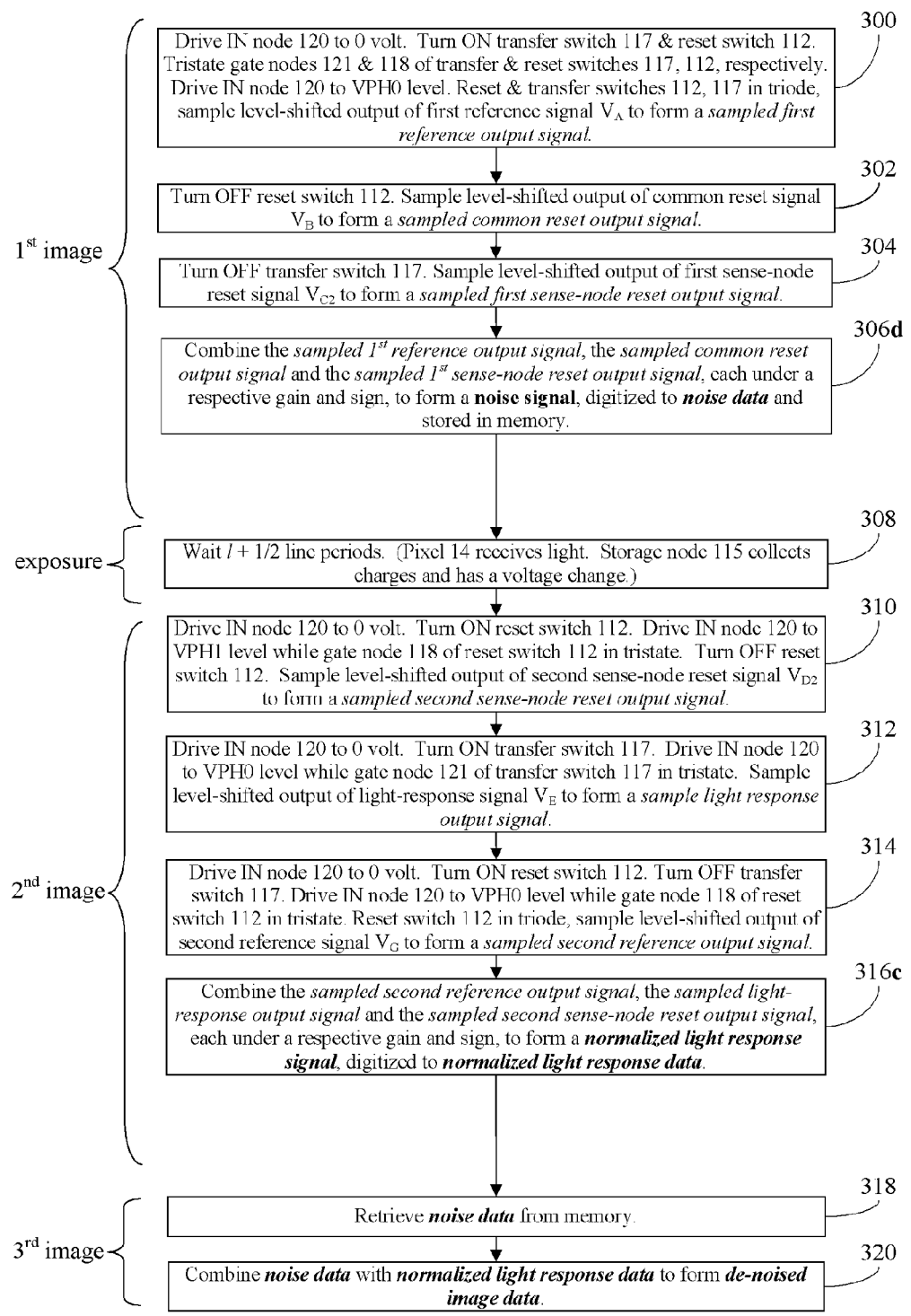
Figure 16:
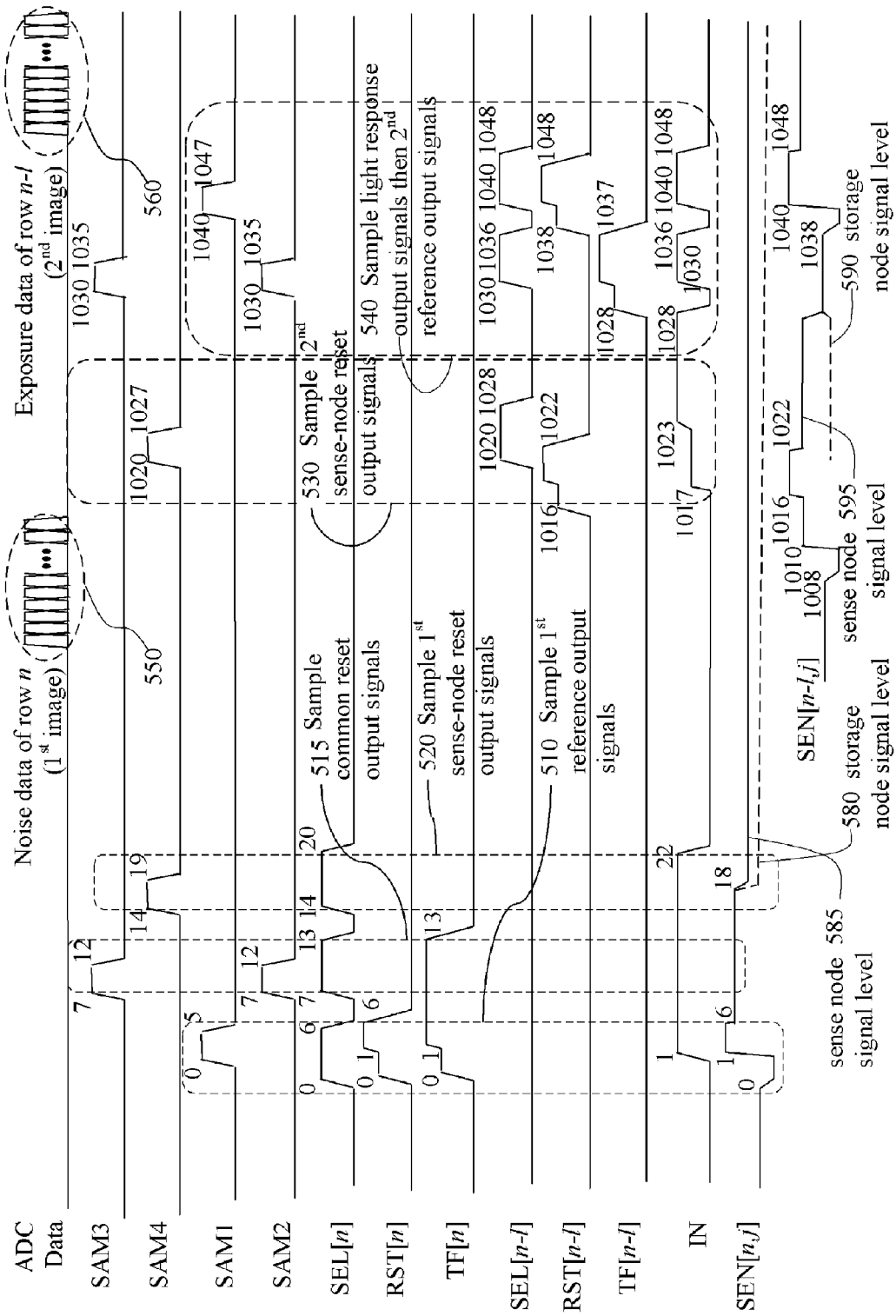
Figure 17A:
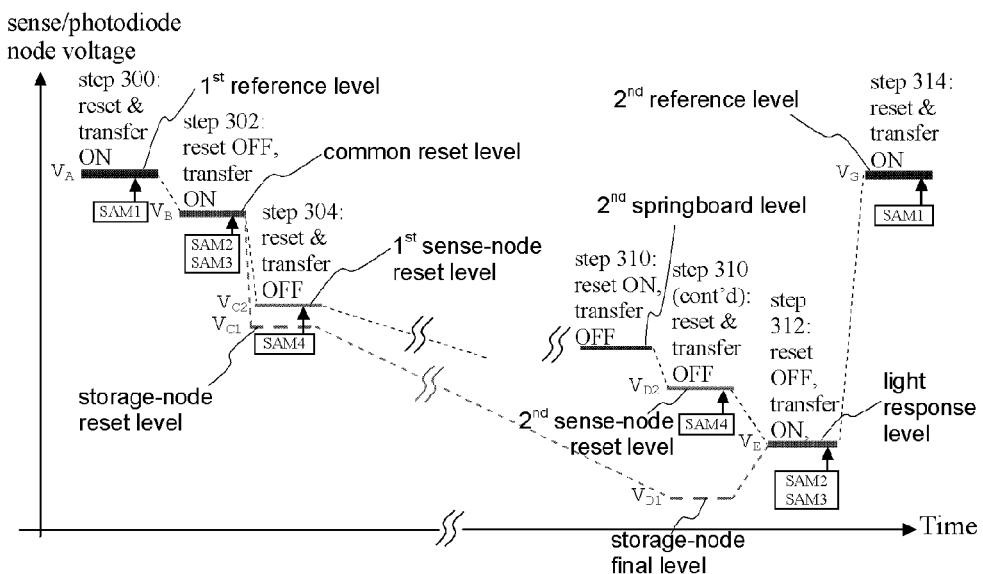
Figure 17B:
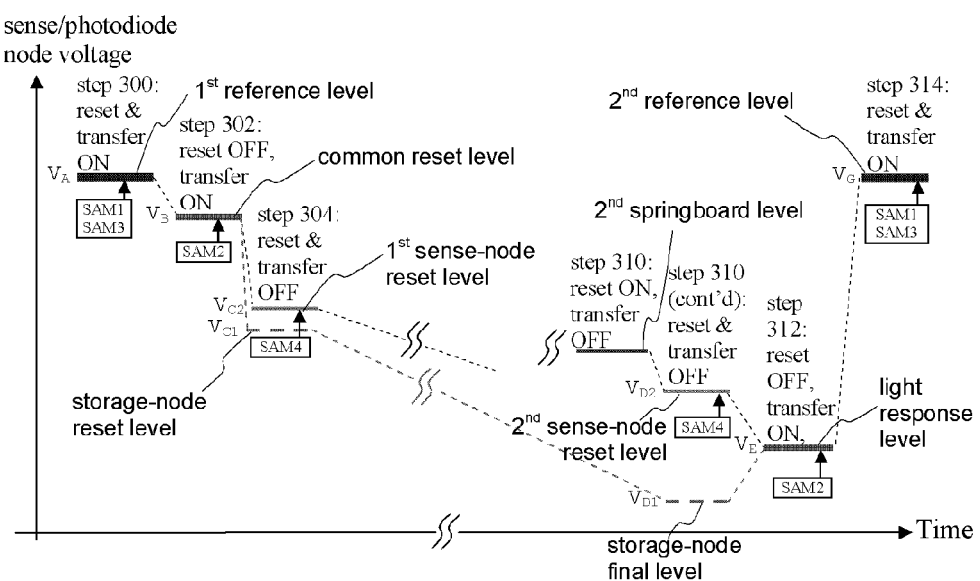
Figure 17C:
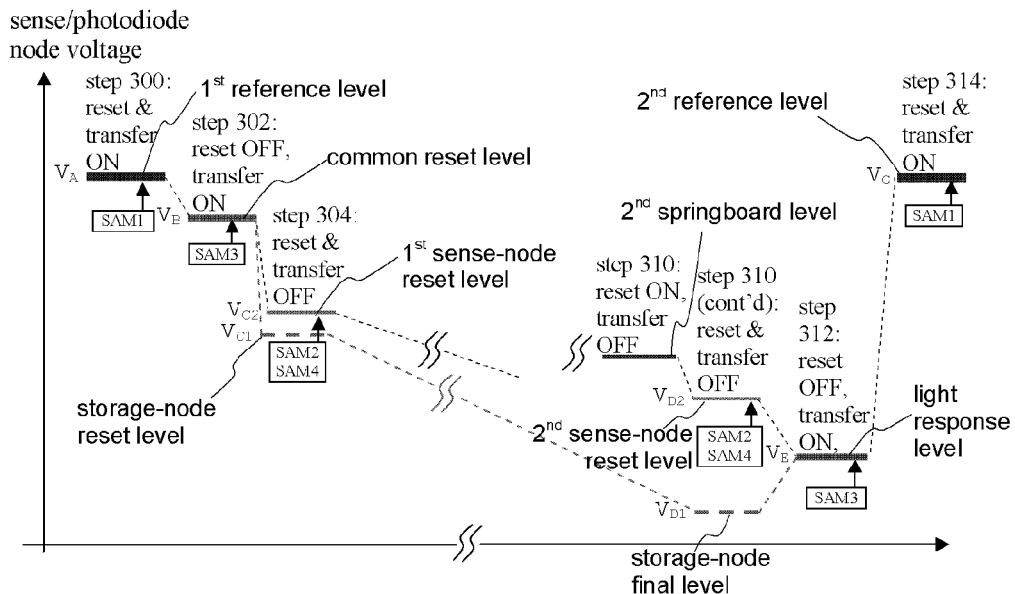
Figure 17D:
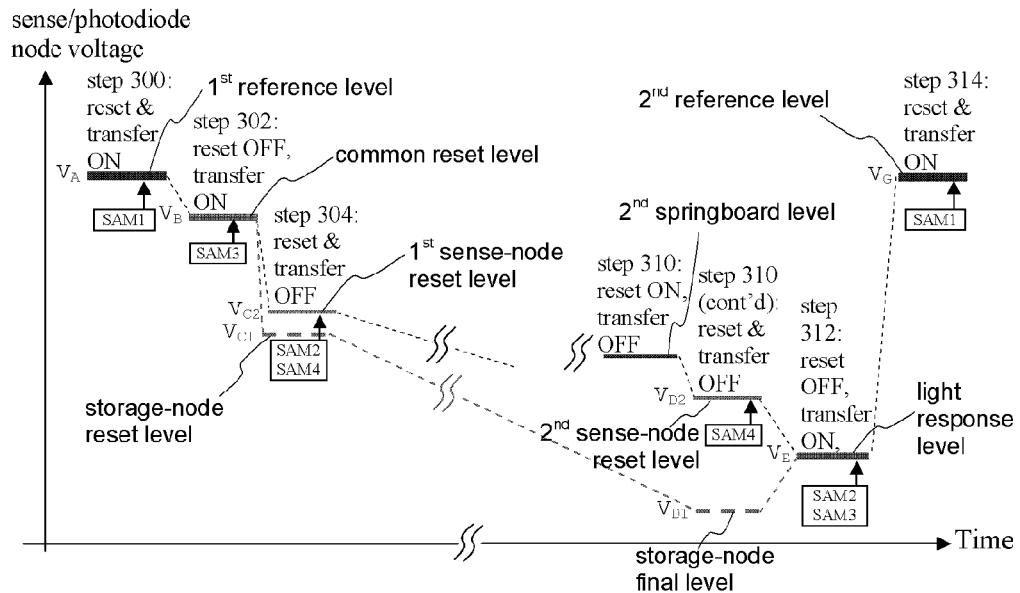
Figure 17E:
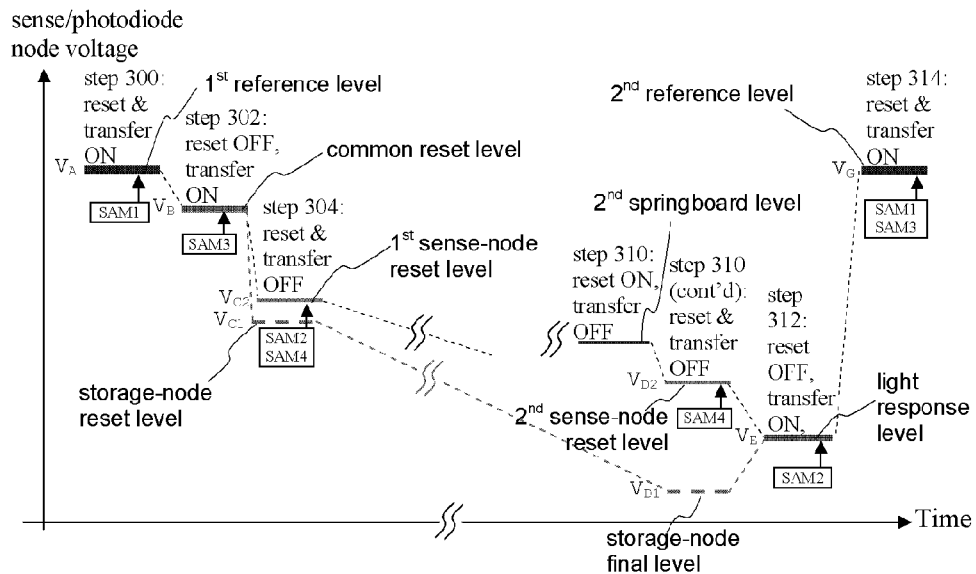
Figure 17F:
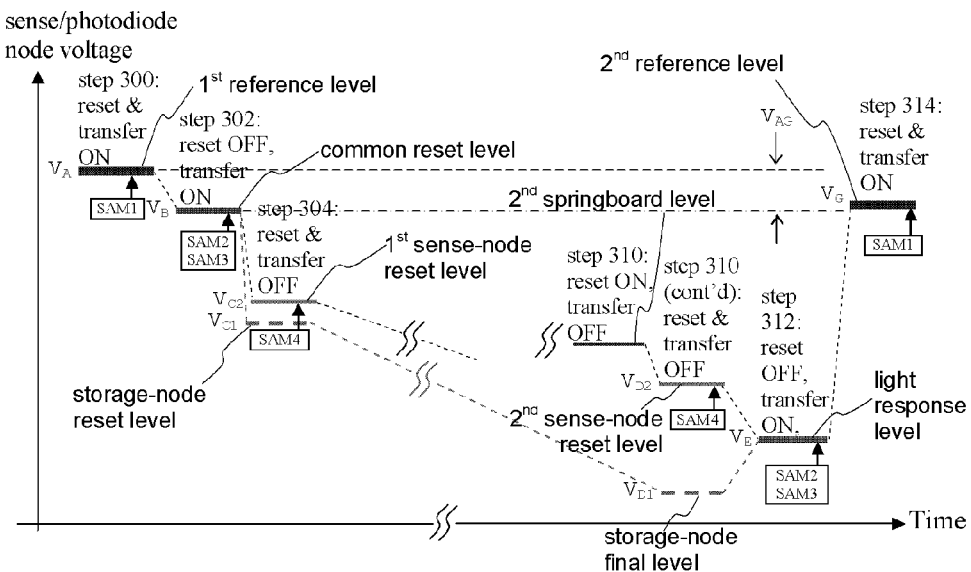
Figure 17G:
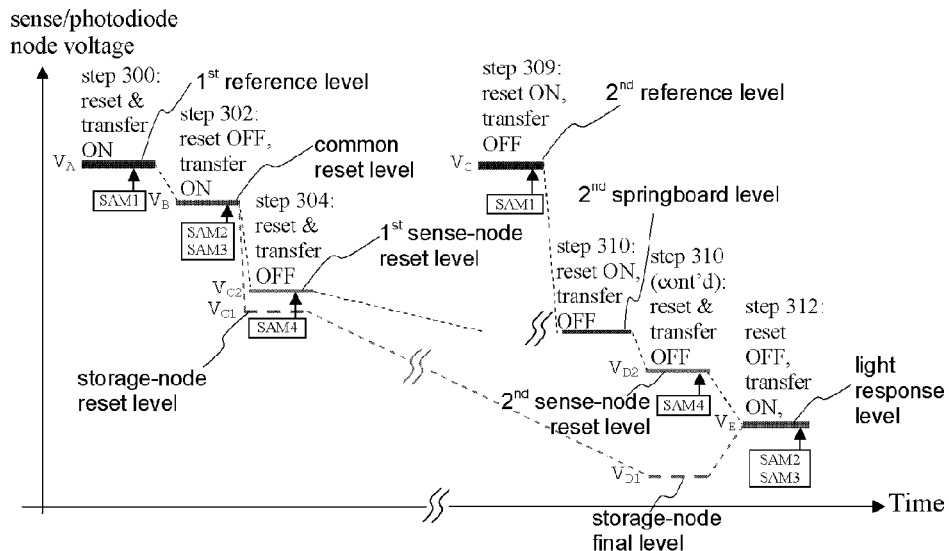
Figure 17H:
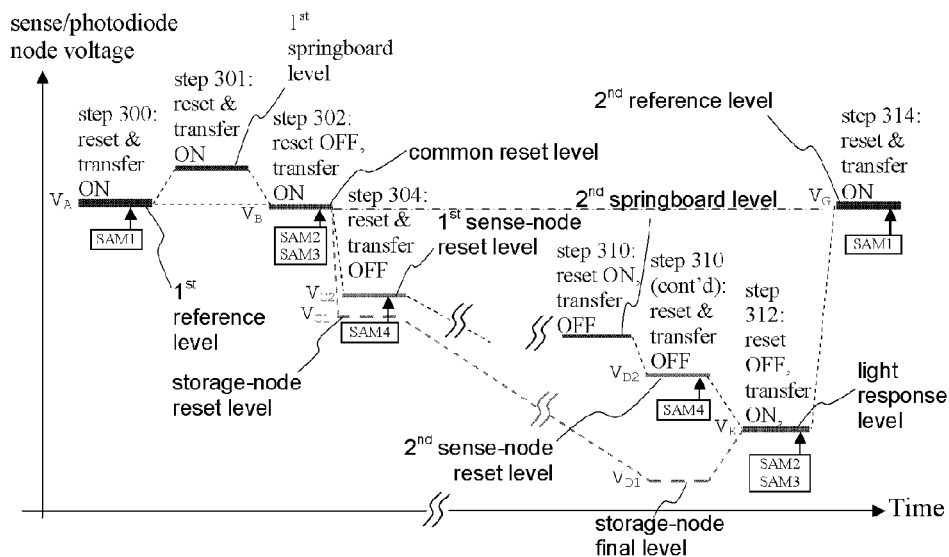
Figure 17I:
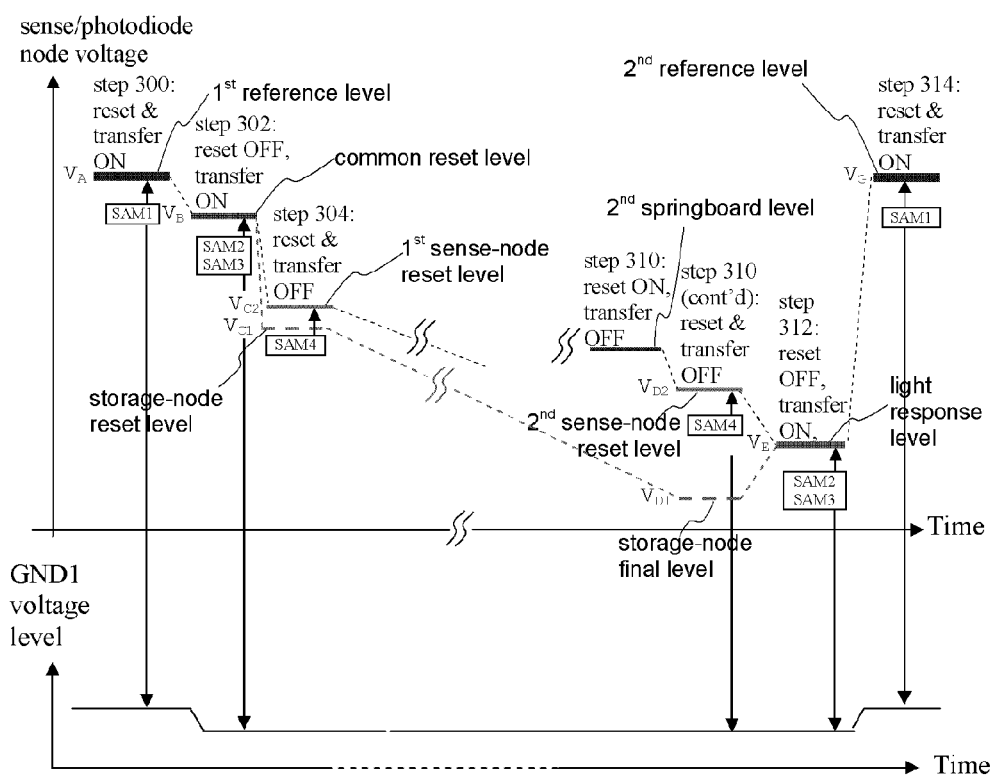
Figure 17J:
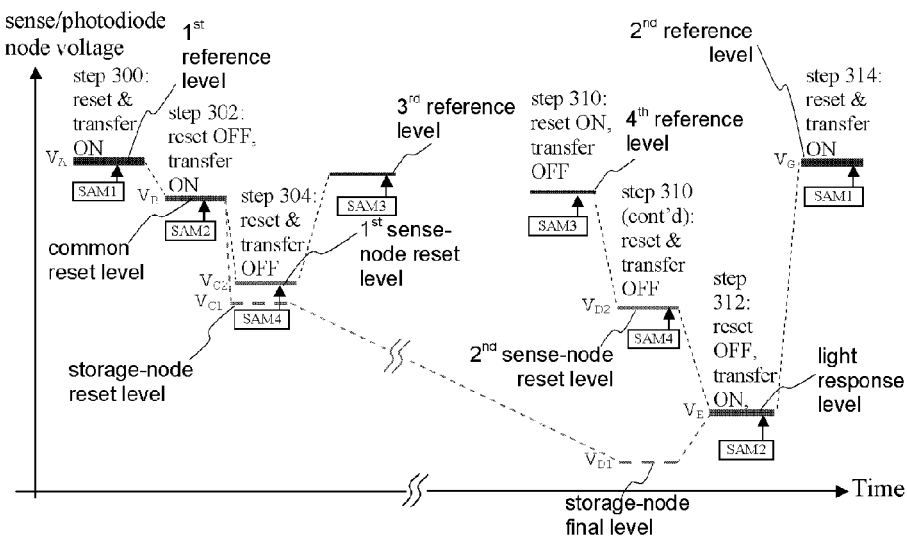
Figure 17K:
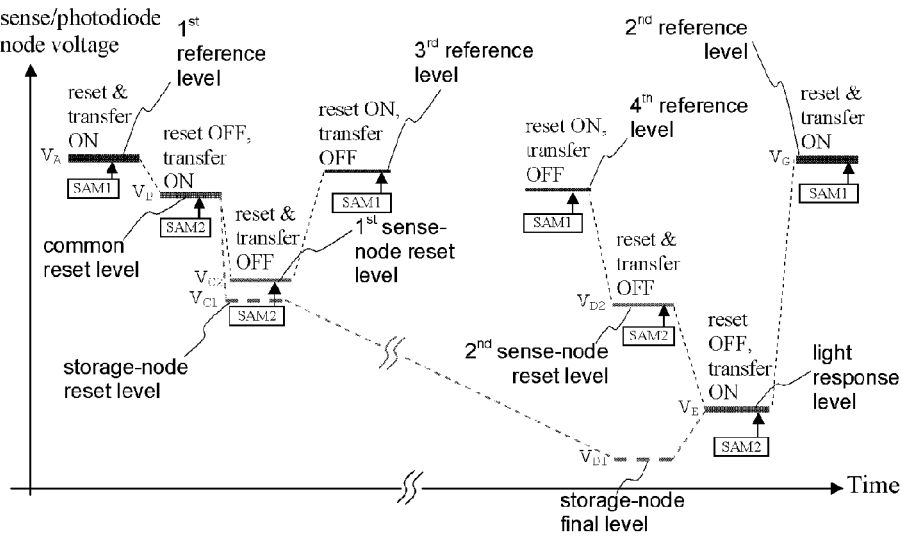
Figure 17L:
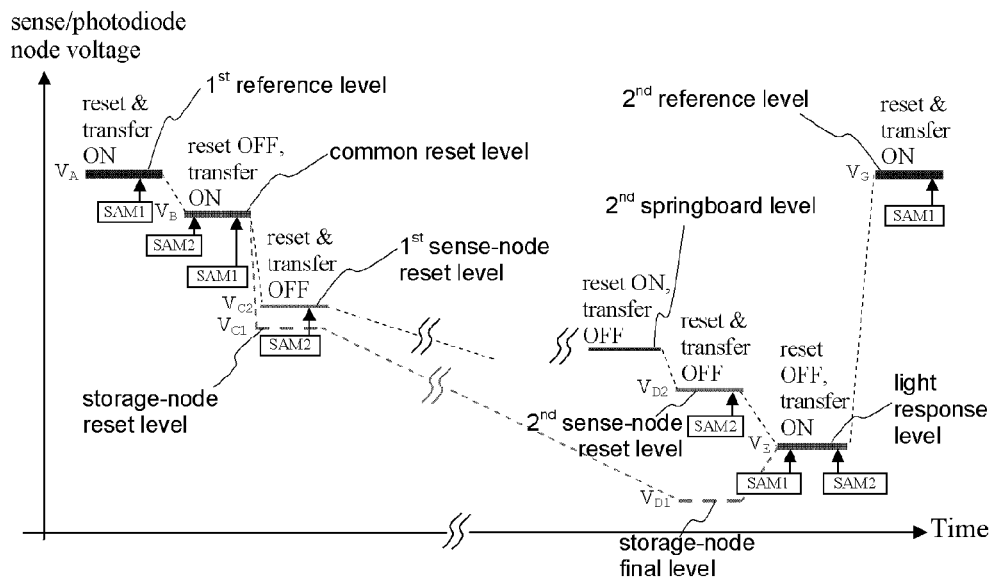
Figure 17M:
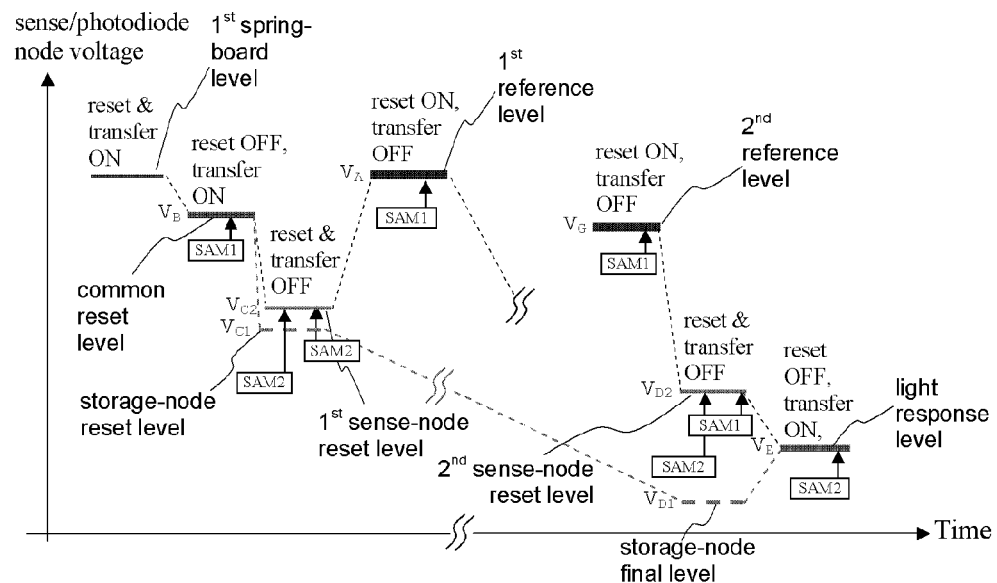
Figure 18A:
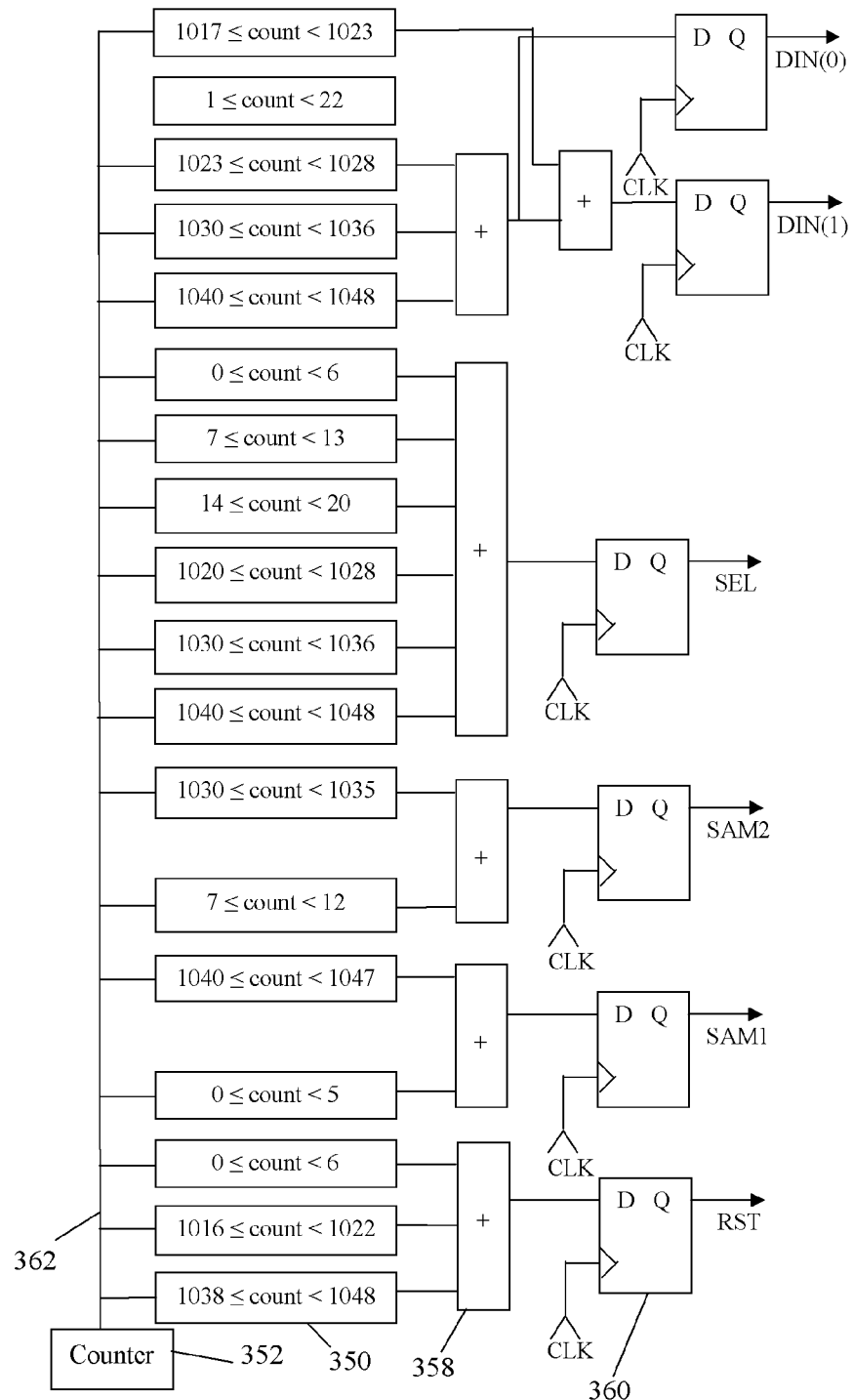
Figure 18B:
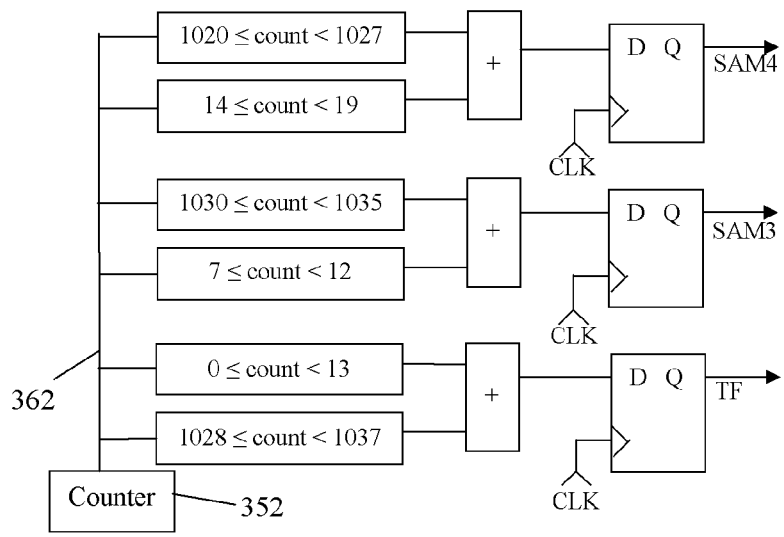
Figure 18C:
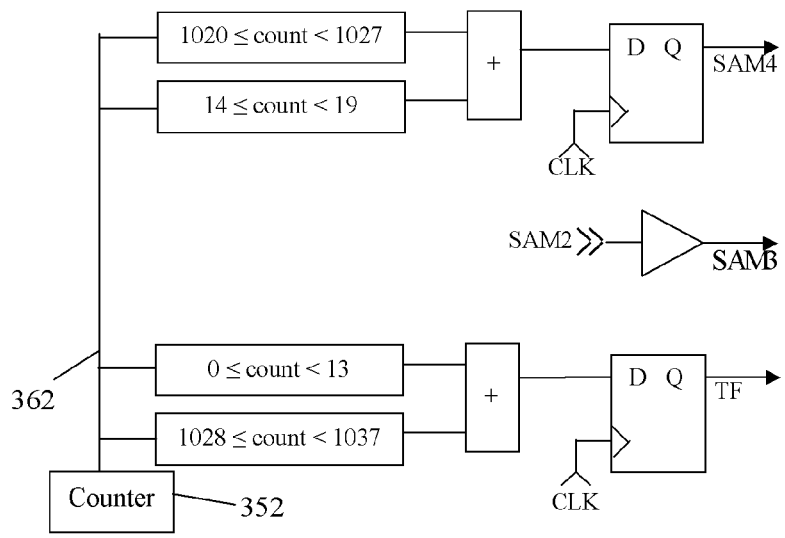
Figure 18D:
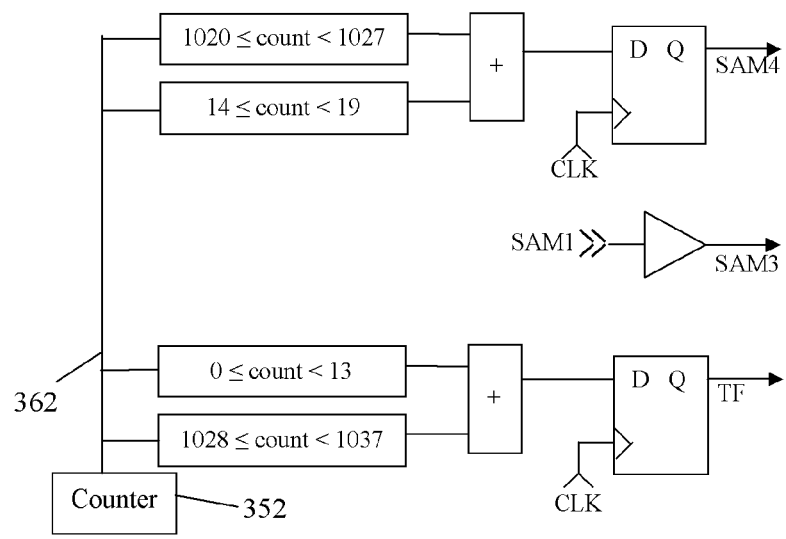
Figure 19:
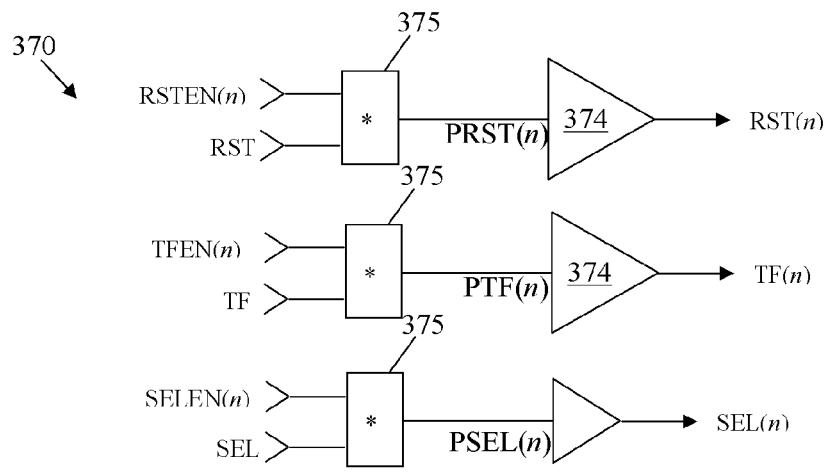
Figure 20:
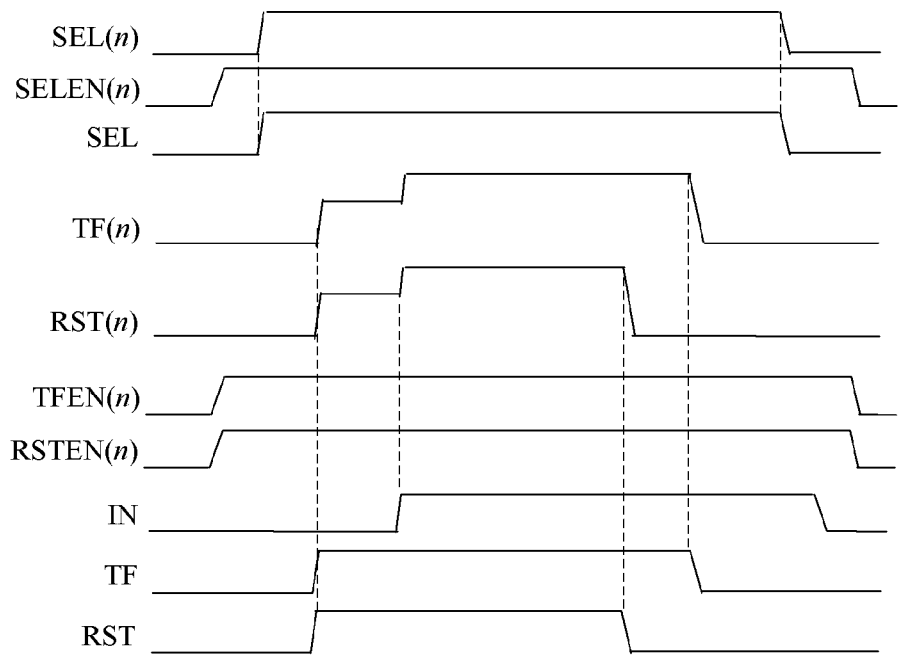
Figure 21:
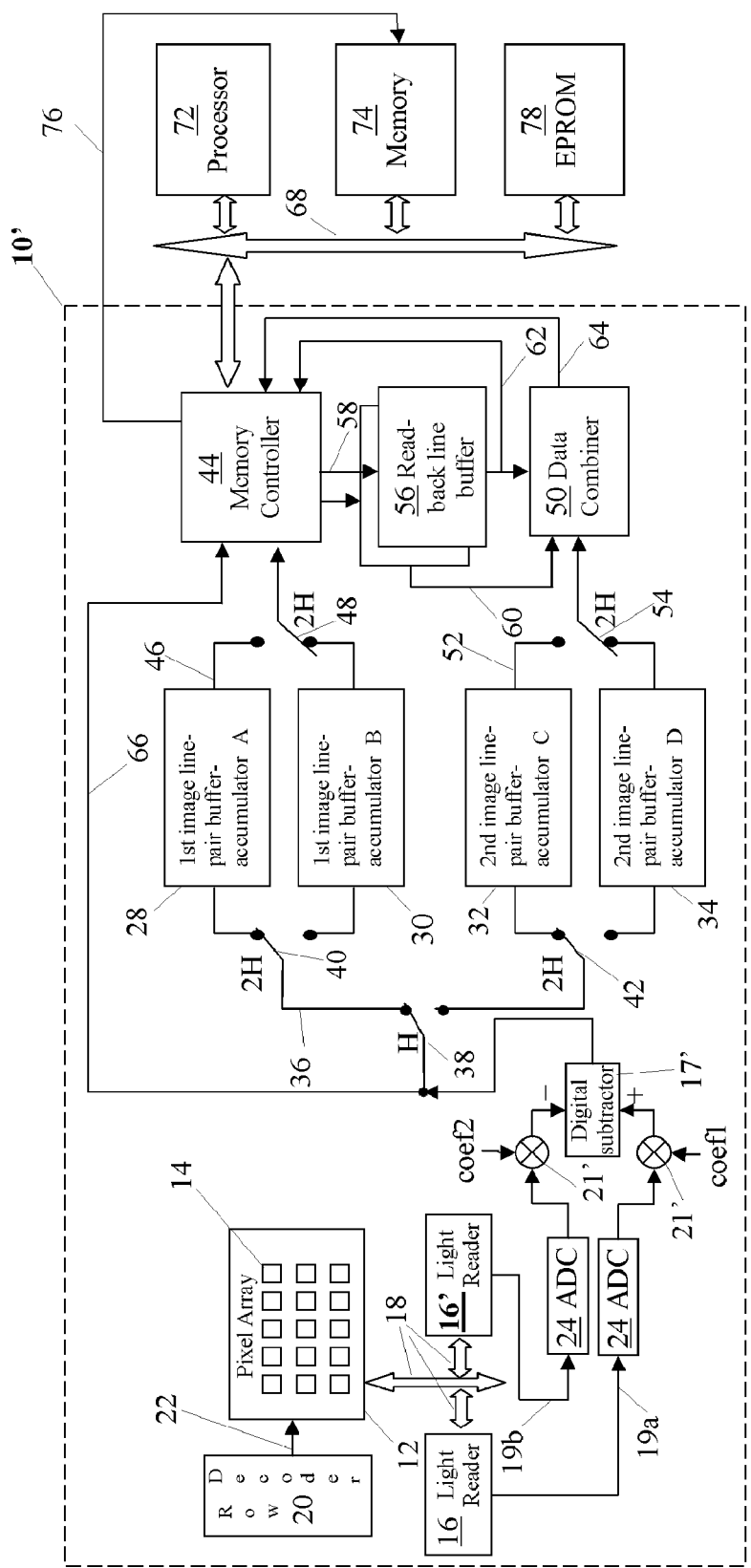
Figure 22:
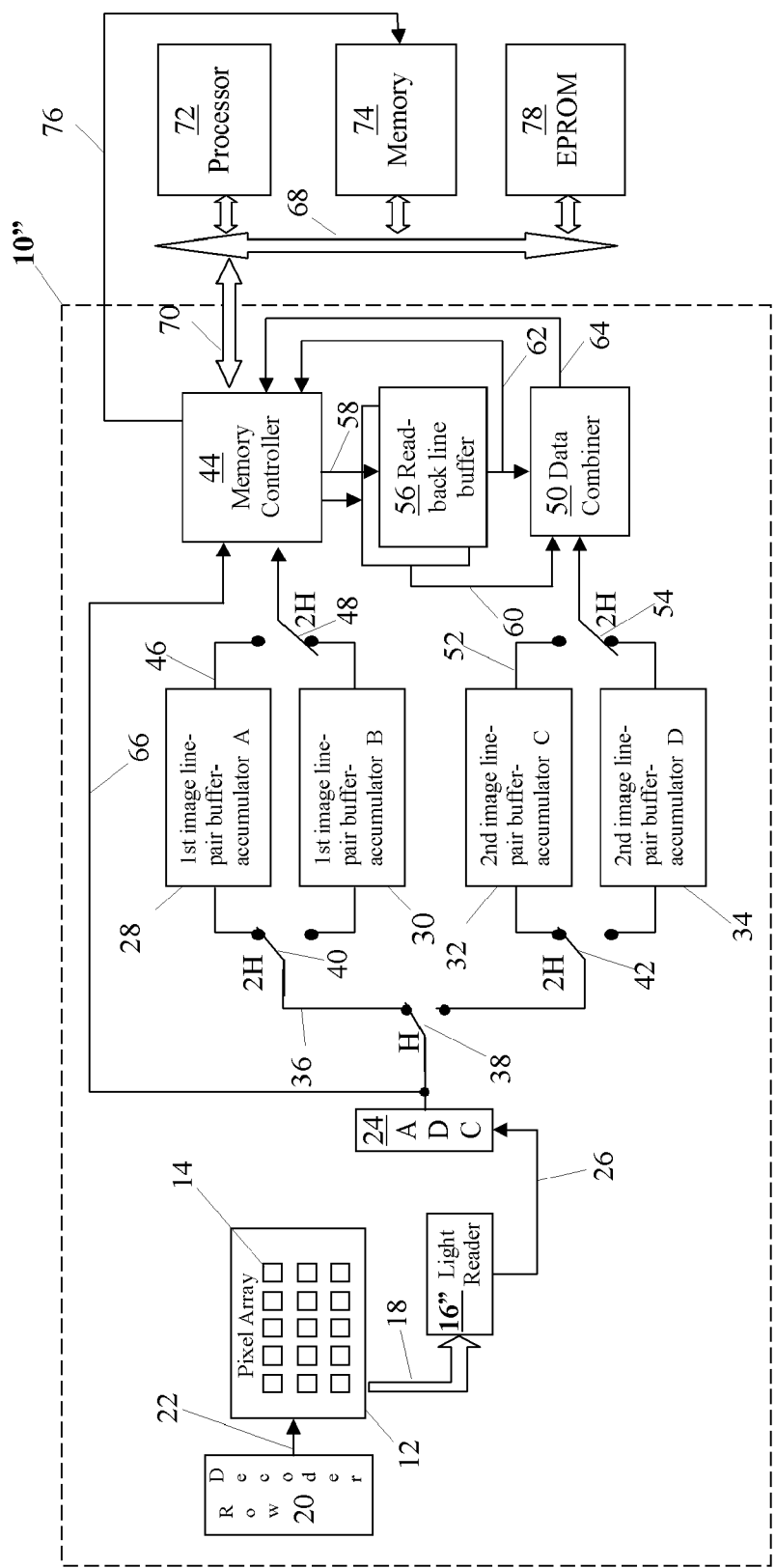
Figure 23:
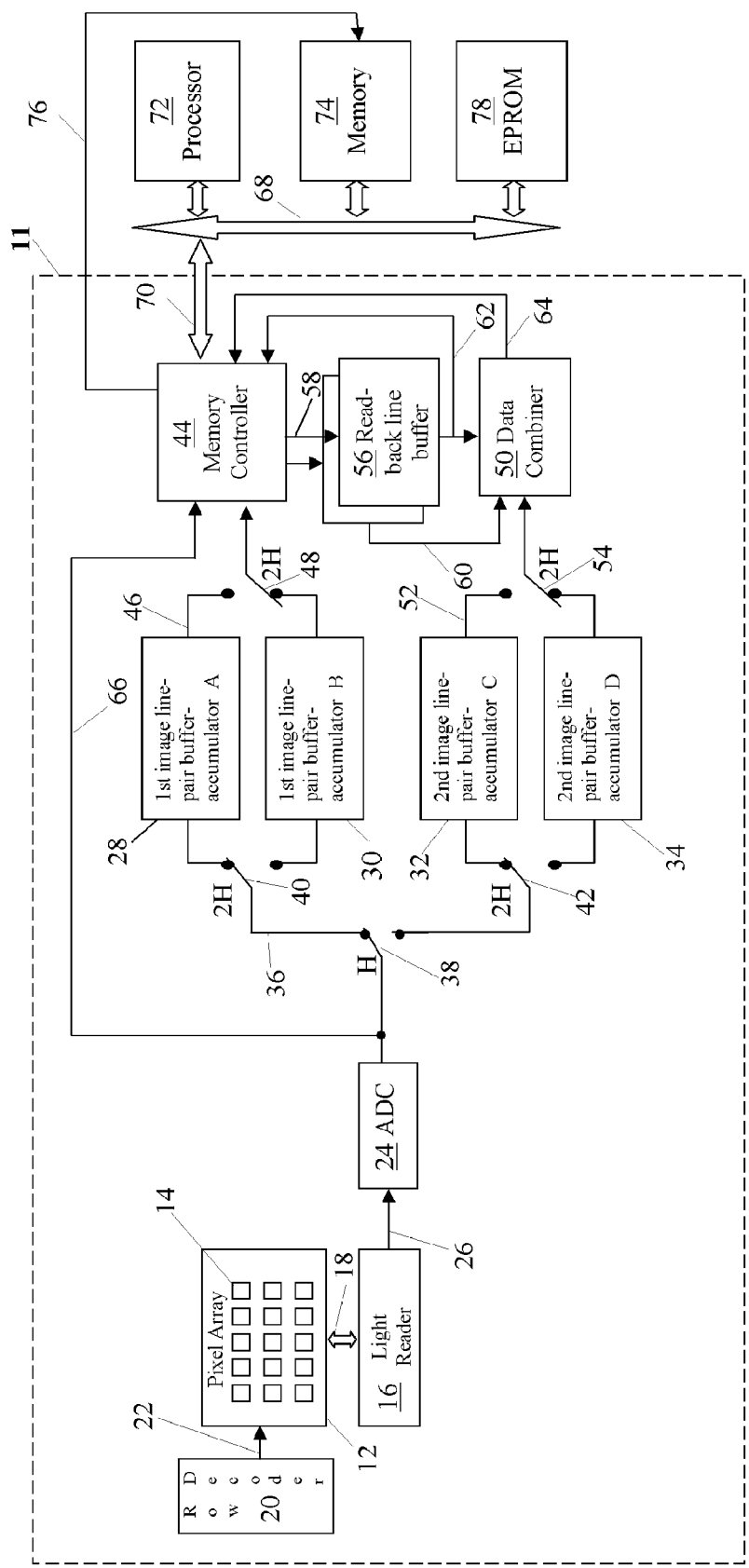
Figure 24:
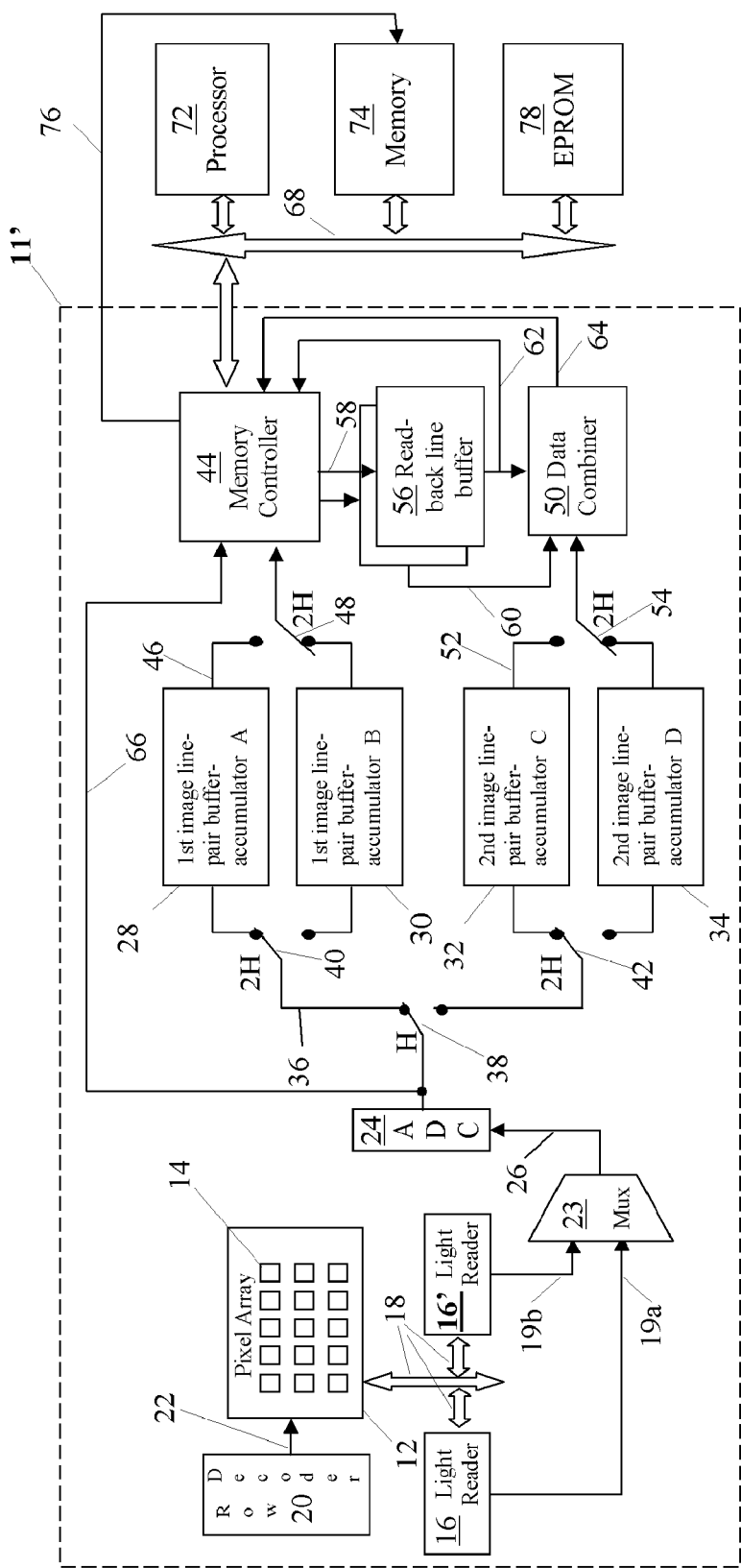
Figure 25:
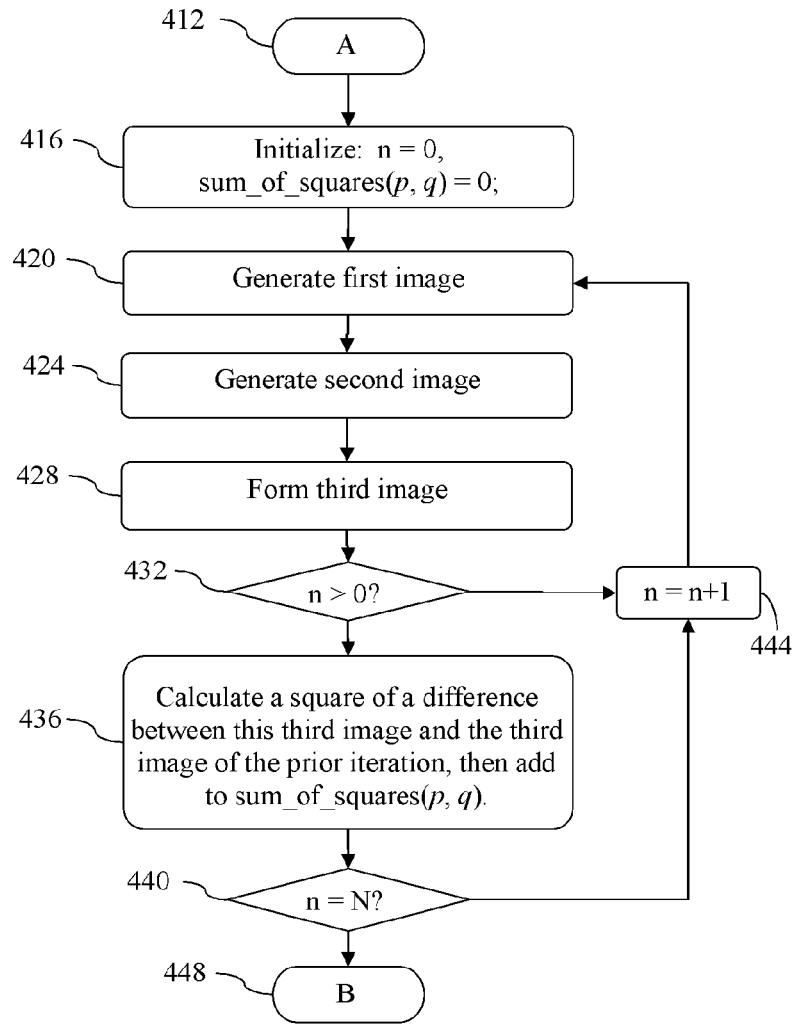
Figure 26:
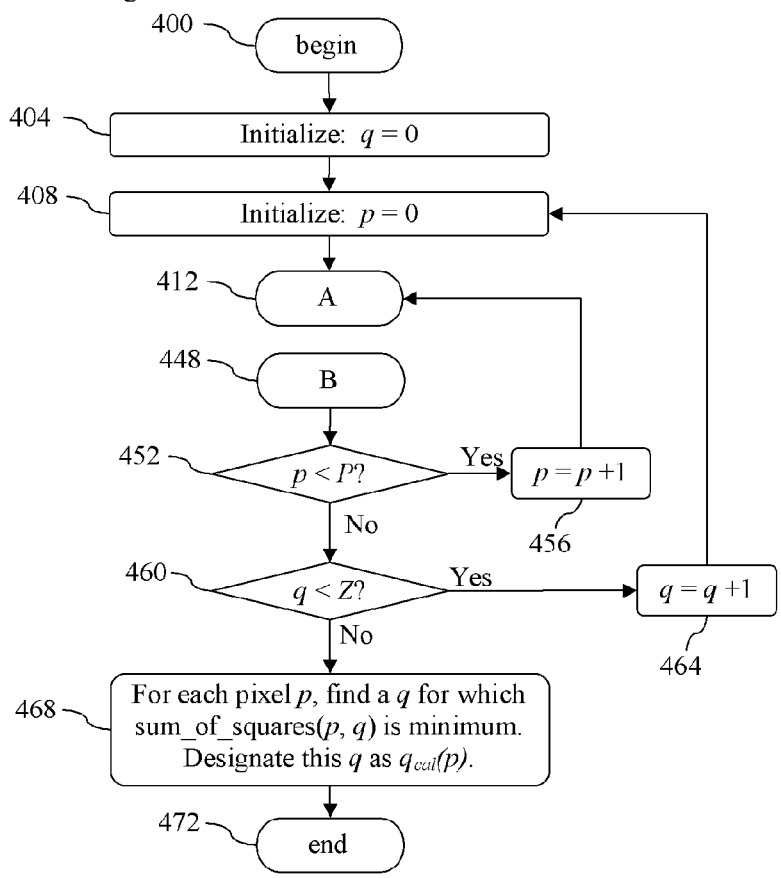
Figure 27:
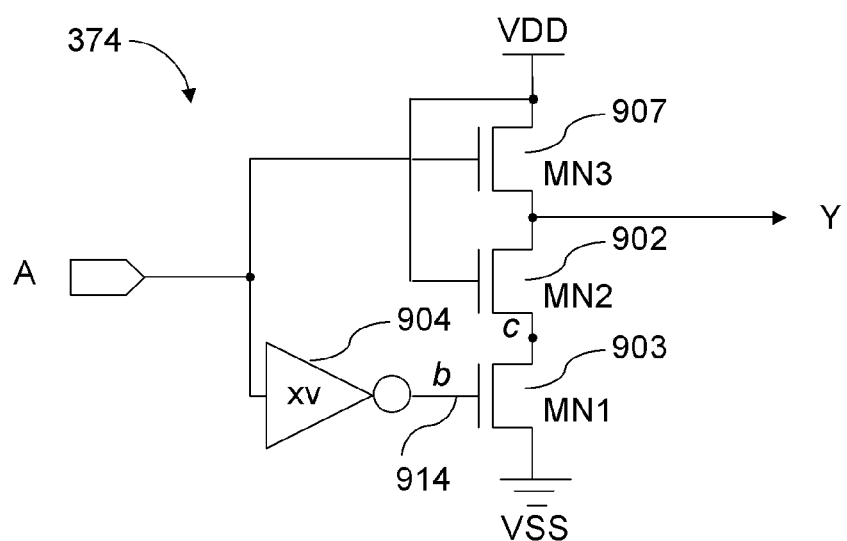

FIG. 5 is a schematic of a first embodiment of a variable capacitor in the light reader circuit of FIG. 14C;

FIG. 6 is a schematic of a second embodiment of a variable capacitor in the light reader circuit of FIG. 14C;

FIG. 7 is a schematic of a third embodiment of a variable capacitor in the light reader circuit of FIG. 14C;

FIG. 8 is an illustration of another method for retrieving and combining pixel data for an image;

FIG. 9 is an illustration showing a sequencing of image data for the method of FIG. 8 for storing and combining pixel data for an image;

FIG. 10 is a layout arrangement of pixels of two different layout orientations in an array;

FIG. 11 is another layout arrangement of pixels of two different layout orientations in an array;

FIG. 12 is a schematic of an embodiment of a pair of pixels sharing a reset switch, an output transistor and a select switch, and of an IN line driver;

FIG. 13 is a schematic of an embodiment of a pixel of the image sensor and an IN line driver;

FIG. 14A is a schematic of an embodiment of a light reader circuit;

FIG. 14B is a schematic of another embodiment of a light reader circuit;

FIG. 14C is a schematic of an embodiment of a triple-sampling light reader circuit;

FIG. 15A is a flowchart for an operation of the image sensor according to the second noise and normalizing methods;

FIG. 15B is a flowchart for an alternate operation of the image sensor according to the first noise and normalizing methods;

FIG. 15C is a flowchart for an alternate operation of the image sensor according to the third noise and normalizing methods;

FIG. 15D is a flowchart for an operation of the image sensor according to the fourth noise and normalizing methods;

FIG. 16 is a timing diagram for the image sensor operation in FIG. 15D;

FIG. 17A is an illustration showing levels of voltage signals at a storage node and at a corresponding sense node and illustrating a sampling sequence useable for the 2nd noise and normalizing methods;

FIG. 17B is an illustration showing levels of voltage signals at a storage node and at a corresponding sense node and illustrating a sampling sequence useable for the 1st noise and normalizing methods;

FIG. 17C is an illustration showing levels of voltage signals at a storage node and at a corresponding sense node and illustrating a sampling sequence useable for the 3rd noise and normalizing methods;

FIG. 17D is an illustration showing levels of voltage signals at a storage node and at a corresponding sense node and illustrating a sampling sequence useable for mixing the 3rd noise method and 2nd normalizing method;

FIG. 17E is an illustration showing levels of voltage signals at a storage node and at a corresponding sense node and illustrating a sampling sequence useable for mixing the 3rd noise method and 1st normalizing method;

FIG. 17F is an illustration modified from FIG. 17A for the 2nd noise and normalizing methods and illustrating a reference offset;

FIG. 17G is an illustration modified from FIG. 17A for the 2nd noise and normalizing methods and illustrating a second reference before the second sense-node reset;

FIG. 17H is an illustration modified from FIG. 17A for the 2nd noise and normalizing methods and illustrating a first springboard offset;

FIG. 17I is an illustration modified from FIG. 17A for the 2nd noise and normalizing methods and illustrating a GND1 step;

FIG. 17J is an illustration modified from FIG. 17B for the 1st noise and normalizing methods and illustrating a third and a fourth references;

FIG. 17K is an illustration modified from FIG. 17J to describe an operation of the fourth embodiment under the 1st noise and normalizing methods;

FIG. 17L is a diagram modified from FIG. 17A to describe an operation of the fourth embodiment under the 2nd noise and normalizing methods;

FIG. 17M is a diagram modified from FIG. 17J to describe an operation of the fourth embodiment under the 3rd noise and normalizing methods;

FIG. 18A-18C are schematics for a logic circuit for generating control signals;

FIG. 18D is a schematic for a logic circuit for generating the SAM3, SAM4 and TF signals for FIG. 17B;

FIG. 19 is a schematic for a unit of the row decoder for directing global RST, TF and SEL signals from the logic circuit of FIG. 18A-18C into a row of pixels as row signals RST(n), TF(n) and SEL(n);

FIG. 20 is a timing diagram for the unit of row decoder shown in FIG. 19;

FIG. 21 is a schematic of a second embodiment of an image sensor and an image capture system;

FIG. 22 is a schematic of a third embodiment of an image sensor and an image capture system;

FIG. 23 is a schematic of a fourth embodiment of an image sensor and an image capture system;

FIG. 24 is a schematic of a fifth embodiment of an image sensor and an image capture system;

FIG. 25 is a flowchart of a process for calibrating residual noise for a particular set of signed scaling factors for a group of pixels having a similar layout and orientation;

FIG. 26 is a flowchart of a process for calibrating residual noises for a plurality of sets of signed scaling factors across multiple groups of pixels;

FIG. 27 is a schematic of a driver circuit for driving TF[n] & RST[n] signals for a row of pixels.

DETAILED DESCRIPTION

Disclosed is an image sensor that has one or more pixels within a pixel array, each pixel comprising a photodetector and a transfer switch that connects the photodetector to a sense node. The sense node is connected to a vertical signal line via a reset switch. An output transistor is connected to couple an output signal to a vertical OUT line from the sense node. The pixel array may be coupled to a control circuit and to one or more subtraction circuits. The control circuit may cause the output transistor to provide a first reference output signal, a common reset output signal, and a first sense-node reset output signal. The transfer switch is in a triode region when the common reset output signal is provided. The reset switch is in a triode region when the first reference output signal is provided. Both the reset and transfer switches are switched off when the first sense-node reset output signal is provided. A subtraction circuit may sample the common reset output signal, the first sense-node reset output signal and the first reference output signal. A subtraction circuit may form a weighted difference between the sampled common reset output signal, the sampled first sense-node reset output signal and the sampled first reference output signal to create a noise signal. The control circuit may cause the pixel to provide a second sense-node reset output signal, a light response output signal and a second reference output signal. The transfer switch is in a triode region when the light response output signal is provided. The reset switch is in a triode region when the second reference output signal is provided. Both the reset and transfer switches are switched off when the second sense-node reset output signal is provided. A subtraction circuit may sample the second sense-node reset output signal, the light response output signal and the second reference output signal. The light response output signal corresponds to an image that is to be captured by the sensor. A subtraction circuit may form a weighted difference between the sampled second sense-node reset output signal, the sampled second reference output signal and the sampled light response output signal to create a normalized light response signal. The noise signal may be subtracted from the normalized light response signal to generate a de-noised signal of the sensor. A DC offset may be further subtracted to form the de-noised signal. An image capture system may comprise the image sensor and a processor that form the de-noised signal. One or more of the steps may be performed on the processor.

A subtraction circuit may provide a noise signal by sampling and subtracting the common reset output signal and the first sense-node reset output signal from the first reference output signal, each scaled by a respective signed scaling factor. The subtraction circuit may provide a normalized light response signal by sampling and subtracting the light response output signal and the second sense-node reset output signal from the second reference output signal, each having been scaled by a respective signed scaling factor.

The noise signal may be subtracted from the normalized light response signal on the image sensor to form a de-noised signal. Alternately, the noise signal and the normalized light response signal may be transferred to an external processor where the noise signal is subtracted from the normalized light response signal.

Alternately, the noise signal and/or the normalized light response signal may be partly formed in the subtraction circuit on the image sensor and partly on the processor. The noise signal may be stored in a memory, and retrieved from the memory subsequently to be subtracted from the normalized light response signal.

A pre-calibrated offset signal may be further subtracted from the normalized light response signal to form the de-noised image signal. The pre-calibrated offset signal may be retrieved from a memory, for instance a non-volatile memory such as a flash memory.

The noise signal may be formed in one of several mutually equivalent methods, referred to in the following as noise methods. Each of the methods may be performed entirely on the image sensor, or partly on the image sensor and partly on the processor.

In a first noise method, a second noise difference is subtracted from a first noise difference, each having been scaled by a respective signed scaling factor. The first noise difference is a result of subtracting the sampled common reset output signal from the sampled first reference output signal. The second noise difference is a result of subtracting the sampled first sense-node reset output signal from the sampled first reference output signal.

In a second noise method, a third noise difference is subtracted from the first noise difference, each having been scaled by a respective signed scaling factor. The first noise difference is as described above. The third noise difference is a result of subtracting the first sense-node reset output signal from the common reset output signal.

In a third noise method, the third noise difference is subtracted from the second noise difference, each having been scaled by a respective signed scaling factor. The second and third noise differences are as described above.

In a fourth noise method, the noise signal is formed directly from the first reference output signal, the first sense-node output signal, and the common-reset output signals, each having been scaled by a signed scaling factor, without forming the first, second, or third noise differences.

There are other possible methods to form the noise signal from the common reset output signal, the first sense-node reset output signal, and the first reference output signal by manipulating the terms according to the rules of algebra, as one skilled in the art can recognize as being equivalent or equivalent to within a multiplying factor and/or an additive constant.

The noise method may be performed partly in analog domain and partly in digital domain, or entirely in analog domain, or entirely in digital domain. Part of the noise method may be performed on an external processor in an image capture system that comprises the image sensor and the processor. The image capture system may comprise a non-volatile memory that contains computer instructions that when executed causes the processor or the image sensor to perform one or more of the calculations in one or more of the noise methods.

Similarly, the normalized light response signal may be formed in one of several mutually equivalent methods, referred to in the following as normalizing methods. Each of the methods may be performed entirely on the image sensor, or partly on the image sensor and partly on the processor.

Each normalizing method has a corresponding counterpart noise method that has a similar set of signed scaling factors.

In a first normalizing method, a second normalizing difference is subtracted from a first normalizing difference, each having been scaled by a respective signed scaling factor. The first normalizing difference is a result of subtracting the light response output signal from the second reference output signal. The second normalizing difference is a result of subtracting the second sense-node reset output signal from the second reference output signal.

In a second normalizing method, a third normalizing difference is subtracted from the first normalizing difference, each having been scaled by a respective signed scaling factor. The first normalizing difference is as described above. The third normalizing difference is a result of subtracting the second sense-node reset output signal from the light response output signal.

In a third normalizing method, the third normalizing difference is subtracted from the second normalizing difference, each having been scaled by a respective signed scaling factor. The second and third normalizing differences are as described above.

In a fourth normalizing method, the normalized light response signal is formed directly from the light response output signal, the second sense-node reset output signal, and the second reference output signal without forming the first, second, or third differences.

There are other possible methods to form the normalized light response signal from the light response output signal, the second sense-node reset output signal, and the second reference output signal by manipulating the terms according to the rules of algebra, as one skilled in the art can recognize as being equivalent or equivalent to within a multiplying factor and/or an additive constant.

The normalizing method may be performed partly in analog domain and partly in digital domain, or entirely in analog domain, or entirely in digital domain. Part of the normalizing method may be performed on an external processor in an image capture system that comprises the image sensor and the processor.

The image capture system may comprise a non-volatile memory that contains computer instructions that when executed causes the processor or the image sensor to perform one or more of the calculations in one or more of the noise and/or normalizing methods.

The first noise method may share a same set of signed scaling factors with the first normalizing method, or within 10% of each other, and may share circuitries that perform at least a part of the methods, e.g. the scaling factors. Likewise the second noise method may share a same set of signed scaling factors with the second normalizing method; the third noise method with the third normalizing method; and the fourth noise method with the fourth normalizing method.

This process increases a signal-to-noise ratio (SNR) of the de-noised image.

Referring to FIG. 13, a pixel 14 comprises a transfer switch 117 and a photodetector 100, e.g. a photodiode. The transfer switch 117 has a source connected to the photodetector 100 and a drain coupled to a gate of an output transistor 116, for instance a source-follower transistor. The source is referred to below as the photodiode node (or storage node) 115, and the drain the sense node 111. A reset switch 112 has a source connected to the sense node 111 and a drain connected to an IN line 120. The reset switch 112 may reset the sense node 111 to a variable bias voltage provided to the pixel array 12 by a driver 17 that can drive the IN line 120 to one of several voltage levels under a control of an control signal DIN. A select switch 114 may be in series with the output transistor 116 such that an output signal from the output transistor 116 is connected to transmit to a OUT line 124 as shown in FIG. 13. OUT line 124 is part of the vertical signals 16 that connect the pixel array 12 to the light readers 16, 16'. Alternately, multiple pixels each comprising a photodetector and a transfer switch may be aggregated together to share a reset switch 112, a select switch 114 and an output transistor 116 to achieve higher areal densities, as shown in FIG. 12. The image sensor 10 is preferably constructed with CMOS fabrication processes and circuits. The CMOS image sensor has the characteristics of being high speed, low power consumption, small pixel pitch and a high SNR.

First Embodiment

Figure 1:
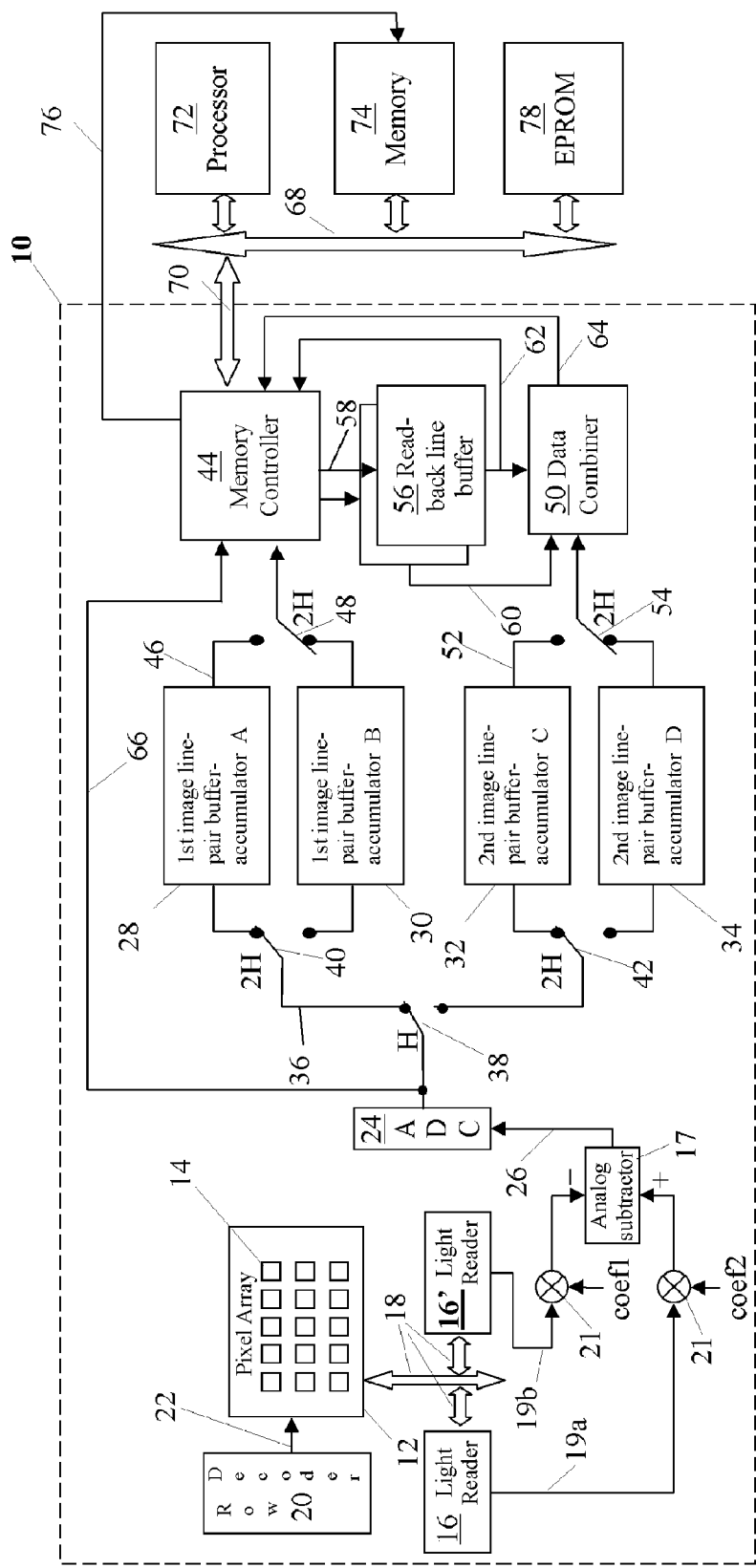
FIG. 1 is a schematic of a first embodiment of an image sensor and an image capture system.

Referring to the drawings more particularly by reference numbers, FIG. 1 shows a first embodiment of an image sensor 10 of the present invention. The image sensor 10 includes a pixel array 12 that comprises a plurality of individual photodetecting pixels 14. The pixels 14 are arranged in a two-dimensional array of rows and columns.

The pixel array 12 is coupled to light reader circuits 16, 16' by a bus 18 and to a row decoder 20 by control lines 22. The row decoder 20 can select an individual row of the pixel array 12. The light readers 16, 16' can then read specific discrete columns within the selected row. Together, the row decoder 20 and light readers 16, 16' allow for the reading of an individual pixel 14 in the array 12.

Outputs 19a, 19b of the light readers 16, 16' may each undergo a respective gain and sign inversion through two gain circuits 21 under a control of signals COEF1 and COEF2, respectively, then mutually subtract at an analog subtractor 17 coupled to the gain circuits 21.

The analog subtractor 17 may be coupled to an analog-to-digital converter 24 (ADC) by output line(s) 26. The ADC 24 generates a digital bit string that corresponds to the amplitude of a signal provided by the analog subtractor 17.

The ADC 24 may be coupled to a pair of first image buffers 28 and 30, and a pair of second image buffers 32 and 34 by lines 36 and switches 38, 40 and 42. The first image buffers 28 and 30 are coupled to a memory controller 44 by lines 46 and a switch 48. The second image buffers 32 and 34 are coupled to a data combiner 50 by lines 52 and a switch 54. The memory controller 44 and data combiner 50 are connected to a read back buffer 56 by lines 58 and 60, respectively. The output of the read back buffer 56 is connected to the controller 44 by lines 62. The data combiner 50 is connected to the memory controller 44 by lines 64. Additionally, the controller 44 is connected to the ADC 24 by lines 66.

The memory controller 44 is coupled to an external bus 68 by a controller bus 70. The external bus 68 may be coupled to an external processor 72, an external memory 74, and/or an electrically-programmable read-only memory (EPROM) 78, which may be a flash memory. The bus 70, processor 72, memory 74, and EPROM 78 are typically found in existing digital cameras, cameras and cell phones.

Data Traffic

To capture a still picture image, the light readers 16, 16' retrieve the sampled first reference output signals, the sampled common-reset output signals and the sampled first sense-node reset output signals for forming the noise data (a first image) of the picture from the pixel array 12 line by line. The switch 38 is in a state that connects the ADC 24 to the first image buffers 28 and 30. Switches 40 and 48 are set so that data is entering one buffer 28 or 30 and being retrieved from the other buffer 30 or 28 by the memory controller 44. For example, the second line of the pixel may be stored in buffer 30 while the first line of pixel data is being retrieved from buffer 28 by the memory controller 44 and stored in the external memory 74.

Figure 2:
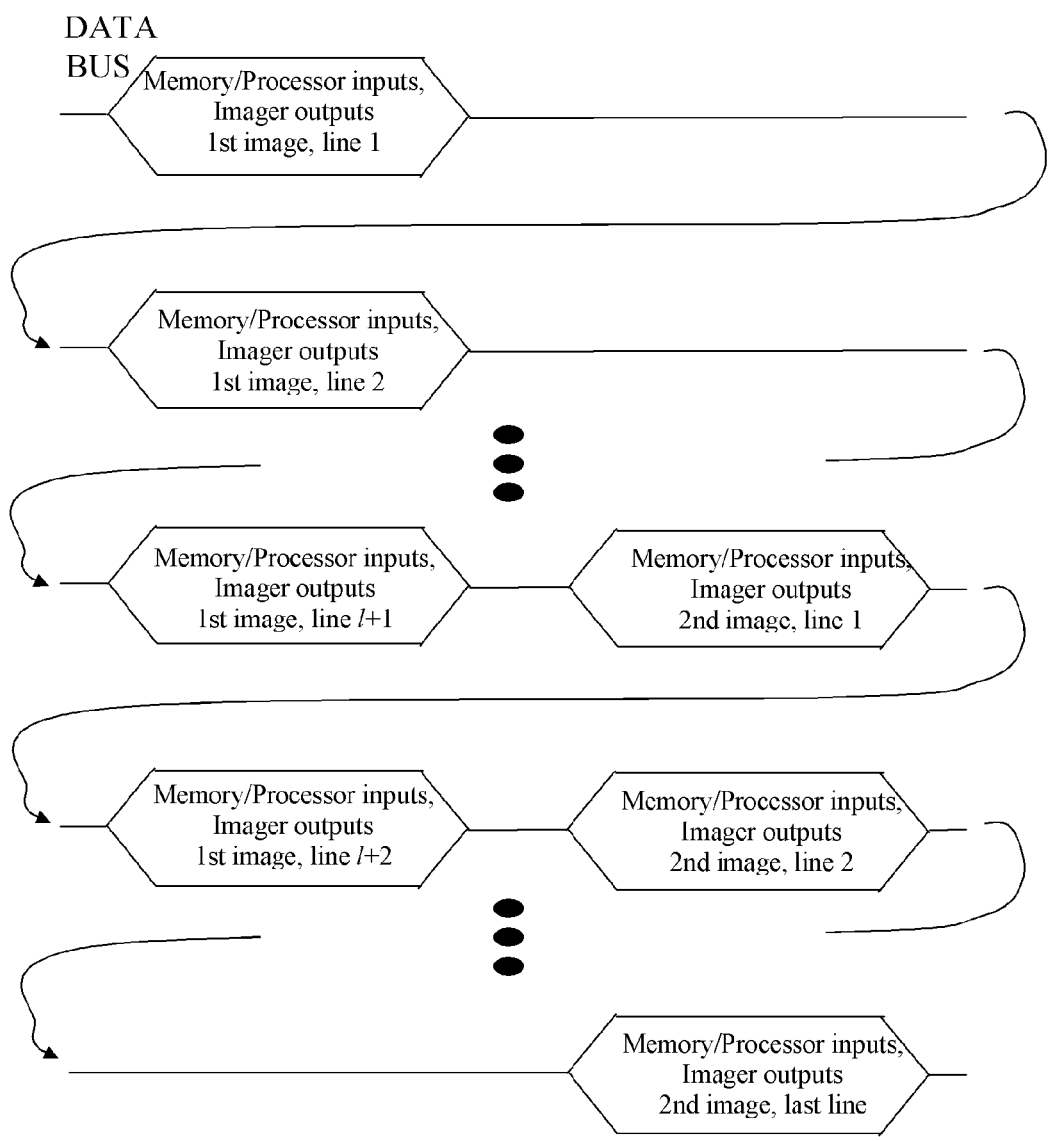
FIG. 2 is an illustration of a method for outputting pixel data for an image to an external memory or processor.

When the first line of the second image (the normalized light response data) of the picture is available the switch 38 is selected to alternately store first image data and second image data in the first 28 and 30, and second 32 and 34 image buffers, respectively. Switches 48 and 54 may be selected to alternatively output first and second image data to the external memory 74 or processor 72 in an interleaving manner. The combiner 50 is configured in a pass-through mode to pass data from second 32 and 34 image buffers to the memory controller 44. This process is depicted in FIG. 2.

There are multiple methods for retrieving and combining the first and second image data. As shown in FIG. 3, in one method each line of the first and second images are retrieved from the external memory 74 at the memory data rate, stored in the read back buffer 56, combined in the data combiner 50 and transmitted to the processor 72 at the processor data rate.

FIG. 8 and FIG. 9 illustrate an alternate method. The lines of pixel data of the first image of the picture may be stored in the external memory 74. When the first line of the second image of the picture is available, the first line of the first image is retrieved from memory 74 at the memory data rate and combined in the data combiner 50 as shown in FIG. 8 and FIG. 9. The combined data is transferred to the external processor 72 at the processor data rate. As shown in FIG. 9, the external memory is both outputting and inputting lines of pixel data from the first image at the memory data rate. FIG. 8 also shows an optional calibration data may be input to the image sensor to be combined to form the combined data in the data combiner 50. The calibration data may be stored in the external memory 74 or a separate EPROM 78.

To reduce noise in the images, the controller 44 preferably transfers data when the light reader 16 is not retrieving output signals.

In another method, both the first and second images may be output to the processor 72, following the sequence timing shown in FIG. 2. The processor 72 may store in a second memory (not shown) the calibration data image retrieved from EPROM 78 during startup of the camera. The processor 72 may store lines of the first image in a third memory (not shown). When a first line of the second image arrives at the processor 72, the processor 72 may retrieve a first line of the calibration data image from the second memory and a first line of the first image from the third memory, and combines them with the first line of the second image to form a first line of the picture. The processor performs likewise for second, third, and subsequent lines of the picture.

Pixel

FIG. 13 shows a schematic for an embodiment of a pixel 14 of the pixel array 12. The pixel 14 may contain a photodetector 100. By way of example, the photodetector 100 may be a photodiode. The photodetector 100 may be connected to a reset transistor (switch) 112 via a transfer transistor (switch) 117. The photodetector 100 may also be coupled to a select transistor (switch) 114 through an output (i.e. source-follower) transistor 116. The transistors 112, 114, 116, 117 may be field effect transistors (FETs).

A gate of the transfer switch 112 may be connected to a TF(n) line 121. A gate of the reset transistor 112 may be connected to a RST(n) line 118. A drain node of the reset transistor 112 may be connected to an IN line 120. A gate of the select transistor 114 may be connected to a SEL line 122. A source node of the select transistor 114 may be connected to an OUT line 124. The RST(n) line 118, SEL(n) line 122, and TF(n) line 126 may be common for an entire row of pixels in the pixel array 12. Likewise, the IN 120 and OUT 124 lines may be common for an entire column of pixels in the pixel array 12. The RST(n) line 118, SEL(n) line 122 and TF(n) line 121 are connected to the row decoder 20 and are part of the control lines 22.

Referring to FIG. 13, the RST(n) line 118 and TF(n) line 121 are driven by tristate buffers 374. FIG. 27 shows a schematic of a tristate buffer 374. The tristated buffer 374 has an input A and an output Y. The output Y may be connected to a supply voltage VDD via a pullup transistor MN3 907. When input A is at a logic low level, the output Y is at low level, e.g. 0 volt. When input A rises to a logic high level, e.g. 3.3 volt, the output Y rises up to a voltage level that is approximately a threshold voltage drop below a gate voltage of the pullup transistor MN3, in this embodiment the logic high level of the input A, then pull-up current diminishes rapidly till becoming essentially zero, in which state the output Y becomes tristated. The RST(n) line 118 and TF(n) line 121 driven to this tristate may be capacitively coupled to an even higher voltage level through a capacitor by a signal that makes a low-to-high transition during the tristated. In this embodiment, a low-to-high transition on the IN line 120 capacitively couples into the RST(n) line 118 and TF(n) line 121 through the gate-to-channel, gate-to-source, gate-to-drain capacitances of reset switch 112 and the capacitance of a metal-to-metal capacitor 126, respectively.

The metal-to-metal capacitor 126 is illustrated in FIG. 4. The IN line 120 may be carried in a metal3 wire. The TF(n) line 121 may be carried in a metal2 wire. An extended metal2 region forms a bottom plate of the capacitor 126. A separate metal top plate insulated from the bottom plate by a insulator such as a silicon nitride of 1000 Angstrom thick sits atop the bottom plate and connects to the metal3 wire through a via called via2.

The IN line may be driven by an IN drive circuit 17 to one of four voltage levels, from highest to lowest, VPH0, VPH1, VPH2, and 0 volt, selectable by control input DIN(1:0). DIN="11" selects VPH0, "10" VPH1, "01" VPH2, and "00" 0 volt.

FIG. 12 shows a schematic of an alternate embodiment for two pixels 14 each being from one of two adjacent rows of the pixel array 12. The two pixels 14 form a pixel pair 14'. The pixel pair 14' includes two photodetectors 100a, 100b connected to a shared sense node 111 via transfer switches 117a, 117b, respectively. Transfer switches 117a, 117b are controlled by horizontal signals TF(n+1) 121a and TF(n) 121b, respectively, connected to their respective gates. A shared reset switch 112 connects the sense node 111 to the vertical IN line 120 under a control of a shared horizontal signal RST(n) 118 that is connected to a gate of the reset switch 112. The reset switch 112 and the transfer switch 117a when turned ON together and each into a triode region by driving both the signal RST(n) 118 and the signal TF(n+1) 121a high can reset the photodetector 100a to a voltage transmitted by the vertical IN signal 120. Likewise, the reset switch 112 and the transfer switch 117b when turned ON together and each into a triode region by driving both the signal RST(n) 118 and the signal TF(n) 121b high can reset the photodetector 100b to a voltage transmitted by the vertical IN signal 120.

Referring to FIG. 12, an output transistor 116 is connected to a vertical OUT line 124 via a select transistor 114 turned ON by horizontal signal SEL(n) 122. The output transistor 116 and the select transistor 114 are shared among the two pairs of photodetector and transfer switch. A signal can be transmitted from photodetector 100a to the vertical OUT line 124 by driving horizontal signals TF(n+1) 121a and SEL(n) 122. Likewise, a signal can be transmitted from photodetector 100b to the vertical OUT line 124 by driving horizontal signals TF(n) 121b and SEL(n) 122.

In a similar manner, three or more pairs of photodetector and transfer switch can share a reset switch, an output transistor and a select switch. Each pair may reside in a different row among a group of adjacent rows. A common select signal and a common reset signal may be shared by the adjacent rows.

Pixel Signal Retrieval: Light Reader

FIG. 14A shows an embodiment of a light reader circuit 16. The light reader 16 may include a plurality of sampling circuits 150 each connected to an OUT line 124 of the pixel array 12. Each sampling circuit 150 may include a first capacitor 152 and a second capacitor 154. The first capacitor 152 is coupled to the OUT line 124 and a virtual ground signal GND1 156 by switches 158 and 160, respectively. The second capacitor 154 is coupled to the OUT line 124 and virtual ground GND1 signal by switches 162 and 164, respectively. Switches 158 and 160 are controlled by a control line SAM1 166. Switches 162 and 164 are controlled by a control line SAM2 168. The capacitors 152 and 154 can be connected together to perform a voltage (and/or charge) subtraction by closing switch 170. The switch 170 is controlled by a control line SUB 172.

The sampling circuits 150 are connected to an operational amplifier 180 by a plurality of first switches 182 and a plurality of second switches 184. The amplifier 180 has a negative terminal "−" coupled to the first capacitors 152 by the first switches 182, and a positive terminal "+" coupled to the second capacitors 154 by the second switches 184. The operational amplifier 180 has a positive output "+" connected to an output line OP 188 and a negative output "−" connected to an output line OM 186. Referring to FIG. 1, for example, for light reader 16 the output lines 186 and 188 are connected to a gain circuit 21 via signal 19a, whereas for light reader 16' the output lines 186 and 188 are connected to another gain circuit 21 via signal 19b.

The operational amplifier 180 provides an amplified signal that is a difference between a voltage stored in the first capacitor 152 and a voltage stored in the second capacitor 154 of a sampling circuit 150 connected to the amplifier 180. The gain of the amplifier 180 can be varied by adjusting the variable capacitors 190. The variable capacitors 190 may be discharged by closing a pair of switches 192. The switches 192 may be connected to a corresponding control line (not shown). Although a single amplifier is shown and described, it is to be understood that more than one amplifier can be used in the light reader circuit 16.

FIG. 14B shows another light reader 16'. The light reader 16' differs from the light reader 16 shown in FIG. 14A in that the first capacitor 152 samples with a SAM3 signal 167 instead of the SAM1 signal 166, and the second capacitor 154 samples with a SAM4 signal 169 instead of the SAM2 signal 168. Referring to FIG. 1, the output lines 186, 188 of light reader 16' are connected to a gain circuit 17 via signal 19b.

Operation

First Embodiment

The first embodiment shown in FIG. 1 can be operated under any combination of any one of the first, second and third noise methods with any one of the first, second and third normalizing methods. FIG. 15A shows a flowchart of an operation of the first embodiment according to the second noise method and the second normalizing method; FIG. 15B an operation according to the first noise method and the first normalizing method; and, FIG. 15C an operation according to the third noise method and the third normalizing method. However, a noise method, e.g. the third noise method, may be used together with a non-corresponding normalizing method, e.g. the second normalizing method. For example, a flowchart for a pairing of the 3rd noise method with the 2nd normalizing method can be assembled by replacing Step 316c of FIG. 15C with Step 316a of FIG. 15A. Likewise, a flowchart for a pairing of the 3rd noise method with the 1st normalizing method can be assembled by replacing Step 306b of FIG. 15B with Step 316c of FIG. 15C.

Corresponding to FIG. 15A to FIG. 15C, respectively, FIG. 17A to FIG. 17C illustrate changes in voltage levels of the storage node 115 of a pixel 14 and a corresponding sense node 111 in a process of generating the noise signal and the normalized light response signal, particularly indicating which among the first reference output signal, the common reset output signal, the first sense-node reset output signal is sampled by the SAM1, SAM2, SAM3 and SAM4 signals, respectively, under the different noise methods, and which among the second reference output signal, the second sense-node reset output signal and the light response output signal is sampled by the SAM1, SAM2, SAM3 and SAM4 signals, respectively, under the different normalizing methods.

Different from FIG. 17A to FIG. 17C, which each illustrates a use of a noise method together with a corresponding normalizing method, FIG. 17D and FIG. 17E illustrate non-corresponding noise and normalizing methods. FIG. 17D illustrates a use of the 3rd noise method with the 2nd normalizing method. FIG. 17E illustrates a use of the 3rd noise method with the 1st normalizing method. These figures illustrate that a noise method may be used together with a non-corresponding normalizing method.

FIG. 17A to FIG. 17E also can each be used to describe an operation of an alternate embodiment of the image sensor of the present invention under the fourth noise method and the fourth normalizing method, which do not form the intermediate signals of noise and normalizing differences.

FIG. 15A shows a flowchart of an operation of a first embodiment of the image sensor 10 according to the second noise method and the second normalizing method. In step 300 a first reference signal is driven onto the sense node 111 via the IN line 120 and then a first reference output signal is output by the output transistor 116 and stored in the light reader 16 as a sampled first reference output signal. Referring to the schematic in FIG. 13 and timing diagram in FIG. 16, this can be accomplished by switching the RST(n) 118, TF(n) 121, and IN 120 lines from a low voltage to a high voltage to turn on the reset switch 112 and into a triode region. The transfer switch 117 may be switched on at the same time to transmit the first reference signal to the photodetector 100 by driving the TF(n) line 121 high. The RST(n) line 118 and TF(n) line 121 are driven high for an entire row. The IN line 120 is driven high for an entire column. The RST(n) line 118 and TF(n) line 121 are first driven high while the IN line 120 is initially low.

The RST[n] line 118 and the TF[n] line 121 may each be connected to be driven by a tri-state buffer 374 whose output enters a tri-state after driving to a high level from 0 volt. Subsequently, when the IN line 120 is switched to a high state from a low state, capacitive coupling (due to gate-to-channel capacitance of reset switch 112, and to a capacitance of the capacitor 126) causes gate voltages of the reset switch 112 and the transfer switch 117 to each rise further to hold the reset switch 112 and transfer switch 117 respectively in a triode region. With the reset switch 112 and the transfer switch 177 in their respective triode region, the voltages at the storage node 115 and the sense node 111 are driven to the voltage level on the IN line 120. Providing a higher gate voltage high enough for the reset switch 112 and the transfer switch 117 to simultaneously remain in triode region allows the photodetector to be reset to a higher level, thus permitting a larger range of voltage swing on the OUT line 124 to support a larger dynamic range in the output signal output from the pixel 14.

The SEL[n] line 122 is also switched to a high voltage level which turns on select switch 114. The voltage of the sense node 111 is coupled to the OUT line 124 through output transistor 116 and select transistor 114 after a level-shifting at the output transistor 116. The SAM1 control line 166 of the light reader 16 (see FIG. 14A) is selected so that the voltage on the OUT line 124 is stored in the first capacitor 152 as a sampled first reference output signal.

Referring to FIG. 15A, in step 302 the sense node 111 and the storage node 115 are then reset and a common reset output signal is stored in the light reader 16 as a sampled common-reset output signal. Referring to FIGS. 13 and 16 this can be accomplished by driving the RST[n] line 118 low to turn off the reset switch 112 and reset the pixel 14 while keeping the TF[n] line 121 at high level such that the transfer switch 117 remains in triode region. Turning off the reset switch 112 creates an error signal across the photodetector 100 due to reset noise, charge injection and clock feedthrough. As shown in FIG. 17A, the error signal reduces the common voltage at the storage node 115 and the sense node 111 to $V_B$ when the reset switch 112 is switched OFF. The SAM2 line 168 and SAM3 line 167 are driven high, the SEL line 122 is driven low and then high again, so that a level-shifted version of the voltage of the sense node 111 is stored as a sampled common-reset output signal in the second capacitor 154 of the light reader 16 (see FIG. 14A) and the first capacitor 152 of the light reader circuit 16' (see FIG. 14B).

Referring to FIG. 15A, in step 304 the transfer switch 117 then turns OFF and a first sense-node reset output signal is then stored in the light reader 16' as a sampled first sense-node reset output signal. Referring to FIGS. 13 and 16, this can be accomplished by driving the TF[n] line 121 low to turn OFF the transfer switch 117. Turning off the transfer switch 117 creates an error signal at the storage node 115 and the sense node 111 due to reset noise, charge injection and clock feedthrough. As shown in FIG. 17A, the error signal reduces the voltage at the storage node 115 to $V_{C1}$ and the sense node 111 to $V_{C2}$, respectively, when the transfer switch 112 is turned OFF. The SAM4 line 169 is driven high, the SEL line 122 is driven low and then high again, so that a level shifted version of the voltage of the sense node 111 is stored as the sampled first sense-node reset output signal in the second capacitor 154 of the light reader circuit 16'.

Referring to FIG. 15A, in step 306a the sampled common reset output signal is then subtracted from the sampled first reference output signal to give a first noise difference signal, and the sampled first sense-node reset output signal subtracted from the sampled common-reset output signal to give a third noise difference signal. The third noise difference signal is then subtracted from the first noise difference signal to give the noise signal, the first and third noise difference signals each under a respective gain. The noise signal is converted to digital bit strings by ADC 24. The digital output data is stored within the external memory 74 in accordance with one of the techniques described in FIG. 2, 3, 8 or 9. The noise data corresponds to the first image. Referring to FIG. 1, FIG. 13, FIG. 14A and FIG. 14B, the subtractions to produce the first and third differences can be accomplished by closing switches 170, 171, 182, 183, 184 and 185 of the light readers 16, 16' to subtract the voltage across the second capacitor 154 from the voltage across the first capacitor 152. The output signals 19a, 19b of light readers 16, 16' representing the first and third noise differences, respectively, are scaled by analog gain circuits 21 under signed scaling factors COEF1 and COEF2, respectively, then mutually subtracted at the analog subtractor 17 to give the noise signal. An ADC 24 coupled to the analog subtractor 17 digitizes the noise signal into noise data, which is subsequently stored in the memory 74.

The signed scaling factors COEF1 and COEF2 may be selected or provided by the external processor 72 or an onboard calibration circuit (not shown) or from a nonvolatile memory onboard or external to the image sensor. The signed scaling factors may be determined or predetermined in accordance with one of a number of calibration methods described later in this description.

Each of the scaling factors COEF1 and COEF2 may have a respective sign. The scaling factors COEF1 and COEF2 may be changed between generating the first image and generating the second image when non-corresponding noise and normalizing methods are in use.

Referring to FIG. 15A, in step 308 the TF[n], RST[n], SEL[n] lines are kept at low for the duration of an exposure time while the photodiode accumulates charges.

Referring to FIG. 15A, in step 310 the sense node 111 is reset and the second sense-node reset output signal is then stored in the light reader 16 as a sampled second sense-node reset output signal. Referring to FIGS. 13 and 16, this can be accomplished by driving the RST[n] line 118 high into tristate, then capacitively coupled to a higher voltage level by driving the IN line 120 from a low level to a high level (hereinafter "second springboard level"), followed by driving the RST[n] line 118 low to turn off the reset switch 112 and reset the sense node 111. The sense-node voltage is now $V_{D2}$, whereas the storage node is $V_{D1}$, as shown in FIG. 17A. The TF[n] line 121 is kept low. The SAM4 line 169 is driven high, the SEL[n] line 122 is driven high, so that a level-shifted version of the sense node voltage is stored as a sampled second sense-node reset output signal in the second capacitor 154 of the light reader circuit 16' (see FIG. 14B). The second springboard level is a sense-node voltage level just before the reset switch 112 is switched OFF for the second sense node reset. The second springboard level may be same as or different from the first reference level.

Referring to FIG. 15A, in block 312 the light response output signal is sampled from the output transistor 116 and stored in the light reader circuits 16, 16' as a sampled light response output signal. The light response output signal corresponds to the optical image that is being detected by the image sensor 10. Referring to FIG. 13, FIG. 14A, FIG. 14B and FIG. 16, this can be accomplished by having the TF[n] 121, SEL[n] 122, SAM3 167 and SAM2 168 lines in a high state, the RST[n] line 118 in a low state and the transfer switch 117 driven into a triode region. FIG. 17A shows $V_E$ as a common voltage of the storage node 115 and the sense node 111. The second capacitor 154 and the first capacitor 152 of the light readers 16, 16', respectively, store a level shifted version of the common voltage of the storage node 115 and the sense node 111 as the sampled light response output signal.

Referring to FIG. 15A, in block 314 the second reference output signal is generated from the sense node 111 and the output transistor 116 and stored in the light reader 16. Referring to FIGS. 13, 14A and 16, the RST[n] line 118 is first driven high and then into a tri-state. The reset switch 112 enters a triode region. The IN line 120 is driven high, capacitively coupling the gate node 118 of the reset switch 112 to a higher voltage level to cause the reset switch 112 to remain in the triode region so that the voltage level at the sense node 111 is driven to the voltage level provided on the IN line 120. The sense node voltage is now at $V_G$ as shown in FIG. 17A. The SEL[n] 122 and SAM1 166 lines are then driven high to store the second reference output voltage in the first capacitor 152—of the light reader 16 as a sampled second reference output signal.

Referring to FIG. 15A, in block 316a the sampled light response output signal is subtracted from the sampled second reference output signal to form a first normalizing difference, the sampled second sense-node reset output signal subtracted from the sampled light response output signal to form a third normalizing difference, and the third normalizing difference subtracted from the first normalizing difference to form a normalized light response signal. The normalized light response signal is converted into a digital bit string to create a normalized light output data that is stored in the second image buffers 32 and 34. The normalized light response signal corresponds to the second image. Referring to FIGS. 13, 14 and 16 the subtraction process can be accomplished by closing switches 170, 182, 183, 184 and 185 of the light readers 16, 16'. The output signals 19a, 19b of light readers 16, 16' representing the first and third normalizing differences, respectively, are scaled by analog gain circuits 21 under signed scaling factors COEF1 and COEF2, respectively, then mutually subtracted at the analog subtractor 17 to give the normalized light response signal. The COEF1 and COEF2 values may be same as that in generating the noise signal, or have a ratio within 10% thereof. The normalized light response signal is then converted into a digital bit string by the ADC 24 as a normalized light response data.

Referring to FIG. 15A, in block 318 the noise data (and may be the calibration data too) are retrieved from external memory. In block 320 the noise data (and calibration data too) are combined with the normalized light output data in accordance with one of the techniques shown in FIG. 8 in the image sensor by the combiner 50, or in FIG. 2 by the processor 72. The noise data corresponds to the first image and the normalized light output data corresponds to the second image. Thus a reset noise in the normalized light response data is removed to form a de-noised image. The image sensor performs this noise cancellation with a pixel that has only four transistors, having reduced dark current on the storage node 115 by separating the storage node 115 from the sense node 111 using the transfer switch 117. Employing sharing of the select switch 114 and the output transistor 116 among neighboring photodetectors can achieve fewer than two transistors per pixel. This image sensor thus provides noise cancellation while maintaining a relatively small pixel pitch.

FIG. 17A illustrates a use of the first embodiment of the image sensor of FIG. 1 under the flowchart of FIG. 15A. The first noise and normalizing differences are formed in the light reader 16, which samples the first reference output signal with the SAM1 signal 166 for step 300 and samples the common reset output signal with the SAM2 signal 168 for step 302 of the flowchart in FIG. 15A and, after a light exposure, samples the second reference output signal with the SAM1 signal 166 for step 314 and samples the light response output signal with the SAM2 signal 168 for step 312 of the flowchart. The third noise and normalizing differences are formed in the light reader 16', which samples the common reset output signal with the SAM3 signal 167 for step 302 and samples the first sense-node reset output signal with the SAM4 signal 169 for step 304 of the flowchart in FIG. 15A and, after the light exposure, samples the light response output signal with the SAM3 signal 167 for step 314 and samples the second reset output signal with the SAM4 signal 169 for step 312 of the flowchart.

Accordingly, FIG. 17A shows the SAM1 signal 166 sampling the first reference output signal, the SAM2 168 and SAM3 167 signals sampling the common reset output signal, and the SAM4 signal 169 sampling the first sense-node reset output signal to form the noise signal. FIG. 17A also shows the SAM1 signal 166 sampling the second reference output signal, the SAM2 168 and SAM3 167 signals sampling the light response output signal, and the SAM4 signal 169 sampling the second sense-node reset output signal to form the normalized light response signal after the light exposure. The light reader 16 forms the first noise and normalizing differences. The light reader 16' forms the third noise and normalizing differences. The analog subtractor 17 subtracts between the first noise difference and the third noise difference, each scaled with a respective signed scaling factor, to form the noise signal according to the second noise method. The analog subtractor 17 subtracts between the first normalizing difference and the third normalizing difference, each scaled with a respective signed scaling factor, to form the normalized light response signal according to the second normalizing method.

The process described is performed in a sequence across the various rows of the pixels in the pixel array 12. As shown in FIG. 16, noise signals may be generating from the n-th row in the pixel array while normalized light response signals generate from the n−1-th row, where l is the exposure duration in multiples of a line period.

As mentioned above, step 306a of the flowchart in FIG. 15A may be replaced with step 306b of FIG. 15B or step 306c of FIG. 15C. Also, step 316a in FIG. 15A may be replaced with step 316b of FIG. 15B or step 316c of FIG. 15C.

FIG. 17B illustrates a use of the first embodiment of the image sensor of FIG. 1 under the flowchart of FIG. 15B. In FIG. 15B, the steps 306a, 316a of FIG. 15A are replaced with steps 306b, 316b, where the second noise difference replaces the third noise difference and the second normalizing difference replaces the third normalizing difference, respectively. The second noise and normalizing differences are formed in the light reader 16', which samples the first reference output signal with the SAM3 signal 167 for step 300 and samples the first sense-node reset output signal with the SAM4 signal 169 for step 304 of the flowchart in FIG. 15B and, after a light exposure, samples the second reference output signal with the SAM3 signal 167 for step 314 and samples the second sense-node reset output signal with the SAM4 signal 169 for step 310 of the flowchart. Accordingly, FIG. 17B shows the SAM1 166 and SAM3 167 signals sampling the first reference output signal, the SAM2 signal 168 sampling the common reset output signal, and the SAM4 signal 169 sampling the first sense-node reset output signal to form the noise signal. FIG. 17B also shows the SAM1 166 and SAM3 167 signals sampling the second reference output signal, the SAM2 signal 168 sampling the light response output signal, and the SAM4 signal 169 sampling the second sense-node reset output signal to form the normalized light response signal. The light reader 16 forms the first noise and normalizing differences. The light reader 16' forms the second noise and normalizing differences. The analog subtractor 17 subtracts between the first noise difference and the second noise difference, each scaled with a respective signed scaling factor, to form the noise signal according to the first noise method. The analog subtractor 17 subtracts between the first normalizing difference and the second normalizing difference, each scaled with a respective signed scaling factor, to form the normalized light response signal according to the first normalizing method.

FIG. 17C illustrates a use of the first embodiment of the image sensor of FIG. 1 under the flowchart of FIG. 15C. In FIG. 15C, the steps 306*a*, 316*a* of FIG. 15A are replaced with steps 306*c*, 316*c*, where the second noise difference replaces the first noise difference and the second normalizing difference replaces the first normalizing difference, respectively. The second noise and normalizing differences are formed in the light reader 16, which samples the first reference output signal with the SAM1 signal 166 for step 300 and samples the first sense-node reset output signal with the SAM2 signal 168 for step 304 of the flowchart in FIG. 15C and, after a light exposure, samples the second reference output signal with the SAM1 signal 166 for step 314 and samples the second sense-node reset output signal with the SAM2 signal 168 for step 310 of the flowchart. Accordingly, FIG. 17C shows the SAM1 signal 166 sampling the first reference output signal, the SAM3 signal 167 sampling the common reset output signal, and the SAM2 168 and SAM4 169 signals sampling the first sense-node reset output signal to form the noise signal. FIG. 17C also shows the SAM1 signal 166 sampling the second reference output signal, the SAM3 signal 167 sampling the light response output signal, and the SAM2 168 and SAM4 169 signals sampling the second sense-node reset output signal to form the normalized light response signal. The light reader 16 forms the second noise and normalizing differences. The light reader 16' forms the third noise and normalizing differences. The analog subtractor 17 subtracts between the second noise difference and the third noise difference, each scaled with a respective signed scaling factor, to form the noise signal according to the third noise method. The analog subtractor 17 subtracts between the second normalizing difference and the third normalizing difference, each scaled with a respective signed scaling factor which may be same as the one used for the third noise method, to form the normalized light response signal according to the third normalizing method.

FIG. 17D illustrates a use of the first embodiment of the image sensor of FIG. 1 under a mixed pairing of the 3rd noise method with the 2nd normalizing method. Accordingly, FIG. 17D shows the SAM1 signal 166 sampling the first reference output signal, the SAM3 signal 167 sampling the common reset output signal, and the SAM2 168 and SAM4 169 signals sampling the first sense-node reset output signal to form the noise signal. FIG. 17D also shows the SAM1 signal 166 sampling the second reference output signal, the SAM2 168 and SAM3 167 signals sampling the light response output signal, and the SAM4 signal 169 sampling the second sense-node reset output signal to form the normalized light response signal. The light reader 16 forms the second noise difference and the first normalizing difference. The light reader 16' forms the third noise difference and the third normalizing difference. The analog subtractor 17 subtracts between the second noise difference and the third noise difference, each scaled with a respective signed scaling factor, to form a noise signal according to the third noise method. The analog subtractor 17 subtracts between the first normalizing difference and the third normalizing difference, each scaled with a respective signed scaling factor, to form a normalized light response signal according to the second normalizing method.

FIG. 17E illustrates a use of the first embodiment of the image sensor of FIG. 1 under a mixed pairing of the 3rd noise method and the 1st normalizing method. The light reader 16 forms the second noise difference and the first normalizing difference. The light reader 16' forms the third noise difference and the second normalizing difference. The analog subtractor 17 subtracts between the second noise difference and the third noise difference, each scaled with a respective signed scaling factor, to form a noise signal according to the third noise method. The analog subtractor 17 subtracts between the first normalizing difference and the second normalizing difference, each scaled with a respective signed scaling factor, to form a normalized light response signal according to the first normalizing method.

An additional third reference level may be applied in the first noise method. FIG. 17J shows one such example. to implement the first noise method on the first embodiment, one can modify FIG. 17B into FIG. 17J by adding a third reference level to apply onto the sense node 111 immediately after step 304 and change SAM3 to sample during this third reference level and store a sampled third reference output signal instead of sampling during the first reference level in step 300. The second noise difference in this case is the sampled third reference output signal minus the sampled first sense-node reset signal.

Likewise, for the samplings after light exposure, a fourth reference level may be applied onto the sense node 111 before the second sense-node reset in step 310, and SAM3 is moved from step 314 to sample the fourth reference output signal generated at this time to store a sampled fourth reference output signal. The second normalizing difference in this case is the sampled fourth reference output signal minus the sampled second sense-node reset signal. It is noted that here the fourth reference level also takes the role of the second springboard level. However, as one skilled in the art can readily recognize, a second springboard level different from the fourth reference level may be provided on the IN line 120 and driven onto the sense node 111 across the reset switch 112 between the fourth reference level and the second sense-node reset to adjust the second sense-node reset level and concomitantly the light response level.

The corresponding control signals are changed from timing diagram of FIG. 16 of the first embodiment and the corresponding logic circuits are changed from the schematics of FIG. 18A to FIG. 18D, as one skilled in the art would readily know to perform. The third and fourth reference levels may or may not be same as the first and second reference levels. Where they differ, a DC offset may be subtracted in an analog circuit or in a digital circuit or on the external processor 72, as one skilled in the art would readily know to perform.

The first embodiment operating under the second noise and normalizing methods, and further using the GND1 voltage level timing as shown in FIG. 17I (described later in this description) is the best mode.

Second Embodiment

FIG. 21 illustrates a second embodiment of the image sensor. In this alternate embodiment, the analog gain circuits 21 and analog subtractor 17 of the first embodiment in FIG. 1 are replaced with digital gain circuits 21' and digital subtractor 17', respectively, located after the ADCs 24. Alternately, the functions of the analog gain circuits 21 and analog subtractor 17 may be replaced and performed by a digital circuit or an on-board programmable processor that executes computer instructions that when executed cause the on-board programmable processor to perform such functions on digital data from the ADC 24. The second embodiment may be operated like the first embodiment.

Third Embodiment

FIG. 22 illustrates a third embodiment. In the third embodiment, the light readers 16, 16', the analog gain circuits 21 and the analog subtractor 17 of the first embodiment in FIG. 1 are replaced with a triple-sampling light reader 16" shown in FIG. 14C.

FIG. 14C shows a schematic of the triple-sampling light reader 16". The triple-sampling light reader 16" comprises a plurality of triple-sampling circuits 150", each comprising a first pair of capacitors 152, 154 and a second pair of capacitors 153, 155. The first pair of capacitors 152, 154 comprises a first capacitor 152 and a second capacitor 154 that each has a first capacitance. The second pair of capacitors 153, 155 comprises a third capacitor 153 and a fourth capacitor 155 that each has a second capacitance. A ratio between the first capacitance and the second capacitance may be varied. By way of example, the ratio may be determined in accordance with a calibration procedure executed on the image sensor 10" or on the external processor 72 under one of the calibration procedures described later in this description. Within each pair, one capacitor is electrically coupled to a positive terminal "+" of an amplifier 180 while the other capacitor to a negative terminal "−" of the amplifier 180. Together, each pair, the amplifier 190, and a pair of feedback capacitors 190 connected between output terminals and input terminals of the amplifier 180 can perform a subtraction between two voltage signals sampled onto the capacitors within the pair. The light reader 150" may perform a first subtraction to subtract a second voltage on the second capacitor from a first voltage on the first capacitor, a second subtraction to subtract a fourth voltage on the fourth capacitor from a third voltage on the third capacitor, and a third subtraction to subtract a second difference resulting from the second subtraction from a first difference resulting from the first subtraction, by closing switches 170, 171, and 182 to 184 and opening switches 190, each of the first and second differences given a weight equal to the first and second capacitances, respectively. When switches 170, 171 are both closed, the triple-sampling light reader 16" effectively performs the first to third subtractions all at once, without having to form intermediate signals for the first or second differences. Thus the triple-sampling light reader 16" is able to perform any one of the first to third noise methods without forming all of the first to third noise differences under the respective noise method. Likewise, the triple-sampling light reader 16" is able to perform any one of the first to third normalizing methods without forming all of the first to third normalizing differences under the respective normalizing method. Thus it is clear that the light reader 16" is able to perform the fourth noise method which calls for a subtraction among the three constituent component signals of the noise signal, and the fourth normalizing method which calls for a subtraction among the three constituent component signals of the normalized light response signal without having to generate the intermediate noise/normalizing differences. Of the three constituent signals that combine to form the noise signal, a first signal that is sampled by only a capacitor from the first pair of capacitors has a weight of the first capacitance, a second signal that is sampled by a capacitor from the first pair of capacitors and a capacitor from the second pair of capacitors has a weight of either a sum or difference between the first and second capacitances, and a third signal that is sampled by only a capacitor from the second pair of capacitors has a weight of the second capacitance. Likewise is true for the three constituent signals that combine to form the normalized light response signal.

Although a single amplifier 180 is shown and described, it is to be understood that more than one amplifier can be used in the light reader circuit 16".

To capture a noise signal and a normalized light response signal for a pixel 14, the triple-sampling circuit 150" may sample the first reference output signal, the common reset output signal and the first sense-node reset output signal for forming the noise signal, and sample the second reference output signal, the light response output signal and the second sense-node reset output signal for forming the normalized light response signal, according to the flowchart 15D and timing diagram 16. The triple-sampling circuit 150" may sample the first reference output signal onto the first capacitor 152, the first sense-node reset signal onto the fourth capacitor 155, and the common reset output signal onto the second 154 and third 153 capacitors. When switches 170, 171, and 182 to 185 are closed, and switches 158 to 165 and 190 are opened, charges from the first to fourth capacitors are transferred to capacitors 190 around the amplifier 180. This performs effectively a first subtraction between the sampled output signals stored on the first 152 and second 154 capacitors, a second subtraction between the sampled output signals stored on the third 153 and fourth 155 capacitors, and a third subtraction between the results of the first and second subtractions, the results of the first and second subtractions given unsigned scaling factors (or weights) of the first and second capacitances, respectively, like the flowchart of FIG. 15A except the intermediate first and third noise and normalizing differences need not be formed. Thus FIG. 15D shows a flowchart that appropriately describes an operation of the third embodiment.

FIG. 17A shows an example of how the SAM1 to SAM4 sampling signals may be sequenced to operate the third embodiment under the flowchart of FIG. 15A except forming the noise and normalizing differences.

Alternately, the triple-sampling circuit 150" may sample the first reference output signal onto the first 152 and third 153 capacitors, the common reset output signal onto the second 154 capacitor, and the first sense-node reset signal onto the fourth capacitor 155. When switches 170, 171, and 182 to 185 are closed, and switches 158 to 165 and 190 are opened, charges from the first to fourth capacitors are transferred to capacitors 190 around the amplifier 180. This performs effectively a first subtraction between the sampled output signals stored on the first 152 and second 154 capacitors, a second subtraction between the sampled output signals stored on the third 153 and fourth 155 capacitors, and a third subtraction between the results of the first and second subtractions, the results of the first and second subtractions given unsigned scaling factors (or weights) of the first and second capacitances, respectively, like the flowchart of FIG. 15B except the intermediate first and second noise and normalizing differences need not be formed. FIG. 17B shows an example of how the SAM1 to SAM4 signals may be sequenced.

An additional third reference level may be applied in the first noise method, like when the first noise method is applied on the first embodiment, as was already shown in FIG. 17J. As in the first embodiment, to implement the first noise method, one can modify FIG. 17B into FIG. 17J by adding a third reference level to apply onto the sense node 111 immediately after step 304 and change SAM3 sampling to sample during this third reference level and store a sampled third reference output signal instead of sampling during the first reference level in step 300. The second noise difference in this case is the sampled third reference output signal minus the sampled first sense-node reset signal.

Likewise, for the samplings after light exposure, a fourth reference level may be applied onto the sense node 111 before the second sense-node reset in step 310, and SAM3 sampling moved from step 314 to sample the fourth reference output signal generated at this time to store a sampled fourth reference output signal. The second normalizing difference in this case is the sampled fourth reference output signal minus the sampled second sense-node reset signal.

The timings of the control signals are changed from the timing diagram of FIG. 16 of the first embodiment and the logic circuits changed from the schematics of FIG. 18A to FIG. 18D, as one skilled in the art would readily know to perform. The third and fourth reference levels may or may not be same as the first and second reference levels. Where they differ, a DC offset may be subtracted in an analog circuit or in a digital circuit or on the external processor 72, as one skilled in the art would readily know to perform.

For the light reader 16'', although the first and second capacitances give unsigned scaling factors, a sign inversion may be applied through one of several ways. In one way, the connections from the first 152 and second 154 capacitors to the "+" and "−" inputs of the amplifier may be swapped to get a sign inversion on the first capacitance, and likewise for the connections from the third 153 and fourth 155 capacitors to apply a sign inversion on the second capacitance. In another way, the SAM1 166 and SAM2 168 sampling signals for the first 152 and second 154 capacitors may be swapped to apply a sign inversion on the first capacitance, and likewise the sampling SAM3 167 and SAM4 169 signals for the third 153 and fourth 155 capacitors to apply a sign inversion on the second capacitance.

The unsigned scaling factors afforded by the first and second capacitances may combine with one or more ways of applying sign inversion in circuit(s) to provide signed scaling factors. It is clear to one skilled in the art that the inventions in the instant application are not limited to the connections shown in the schematics or described in the description but encompass various modifications, combinations and permutations possible via such ways.

It is also clear to one skilled in the art that similar sign inversions are applicable in light readers 16, 16'. It is clear to one skilled in the art that the inventions in the instant application that use light readers 16, 16' are not limited to the connections shown in the schematics or described in the description but encompass various modifications, combinations and permutations possible via such ways.

Alternately, the triple-sampling circuit 150'' may sample the first reference output signal onto the first capacitor 152, the first sense-node reset signal onto the second 154 and fourth capacitors 155, and the common reset output signal onto the third capacitor 153. When switches 170, 171, and 182 to 185 are closed, and switches 158 to 165 and 190 are opened, charges from the first to fourth capacitors are transferred to capacitors 190 around the amplifier 180. This performs effectively a first subtraction between the sampled output signals stored on the first 152 and second 154 capacitors, a second subtraction between the sampled output signals stored on the third 153 and fourth 155 capacitors, and a third subtraction between the results of the first and second subtractions, the results of the first and second subtractions given unsigned scaling factors (or weights) of the first and second capacitances, respectively, like the flowchart of FIG. 15C except the intermediate second and third noise and normalizing differences need not be formed. FIG. 17C shows an example of how the SAM1 to SAM4 sampling signals may be sequenced.

The third 153 and fourth 155 capacitors may be variable capacitors, whose second capacitance is selected by a control signal CVAL (not shown). FIGS. 5-7 illustrate three possible embodiments of this variable capacitor. Although only two capacitance values are supported by the examples shown in FIG. 5 to FIG. 7, more capacitance values are possible by modifications to the circuits shown as is readily understood by one skilled in the art. Furthermore, the first 152 and second 154 capacitors may be variable capacitors as well to provide more selections for the ratio between the first and second capacitances.

FIG. 5 illustrates one embodiment of a variable capacitor. Three capacitors CS, C0, and C1 are connected in parallel between terminals PIX and AMP. Capacitors C0 and C1 are in series with switches S0 and S1, respectively, to control connectivity. When CVAL=0, the switch S0 is closed whereas the switch S1 is open, causing the capacitor C0 to be connected whereas the capacitor C1 disconnected, giving a total capacitance of C0+CS between terminals PIX and AMP. When CVAL=1, the switch S1 is closed whereas the switch S0 is open, causing the capacitor C1 to be connected whereas the capacitor C0 disconnected, giving a total capacitance of C1+CS between terminals PIX and AMP.

FIG. 6 illustrates another embodiment of a variable capacitor. Two capacitors C0 and C1 are connected in parallel between terminals PIX and AMP. The capacitor C0 and C1 further are in series with switches S0 and S1, respectively, to control connectivity. When CVAL=0, the switch S0 is closed whereas the switch S1 is open, causing the capacitor C0 to be connected whereas the capacitor C1 disconnected, giving a total capacitance of C0 between terminals PIX and AMP. When CVAL=1, switch S1 is closed whereas switch S0 is open, causing capacitor C1 to be connected whereas capacitor C0 disconnected, giving a total capacitance of C1 between terminals PIX and AMP.

FIG. 7 illustrates yet another embodiment of a variable capacitor. Two capacitors CS and C1 are connected in parallel between terminals PIX and AMP. The capacitor C1 is in series with a switch S1 to control connectivity. When CVAL=0, the switch S1 is open, causing the capacitor C1 to be disconnected, giving a total capacitance of CS between terminals PIX and AMP. When CVAL=1, the switch S1 is closed, causing the capacitor C1 to be connected, giving a total capacitance of C1+CS between terminals PIX and AMP.

Fourth Embodiment

FIG. 23 illustrates a fourth embodiment of an image sensor. By way of example, below is described an operation of the fourth embodiment according to the second noise and normalizing methods. The light reader 16 may sample the first reference output signal onto the first capacitor 152 and the common-reset output signal onto the second capacitor 154, output the first noise difference from amplifier 180 to the ADC 24, sample the common-reset output signal onto the first capacitor 152 and the first sense-node reset output signal onto the second capacitor 154, and output the third noise difference to the ADC 24. The ADC 24 digitizes the first and third noise differences. The digitized noise differences may then be transmitted to the external processor 72 which forms the noise signal according to the 2nd noise method. Alternately, the noise signal may be formed on the image sensor 11 by a computing circuit (not shown). In a similar manner, the light reader 16 may sample the second sense-node reset output signal onto the first capacitor 152 and the light response output signal onto the second capacitor 154, output a negated third normalizing difference from the amplifier 180 to the ADC 24, sample the second reference output signal onto the first capacitor 152 and the light response output signal onto the second capacitor 154, and output the first normalizing difference to the ADC 24. The third and first normalizing differences are digitized. The digitized normalizing differences may be transmitted to the external processor 72 to be combined to form the normalized light response signal according to the first normalizing method. Alternately, the normalized light response signal may be formed on the image sensor 11 by a computing circuit (not shown).

Note that the negated third normalizing difference may be provided to the ADC 24 instead of the unnegated third normalizing difference, or vice versa, by interchanging the signals sampled by the first 152 and second 154 capacitors, to provide a signal polarity better suited to the input range of the ADC 24, as is well known to one skilled in the art.

In the fourth embodiment, the light reader 16 may form any two noise differences among the first to third noise differences and any two normalizing differences among the first to third normalizing differences, and transmit the differences to the ADC 24 to be digitized then either transmitted to the external processor 72 or to be processed on the image sensor 11 to form the noise signal and the normalized light response signal according to the corresponding noise and normalizing method, respectively, then subtract the noise signal from the normalized light response signal to form the de-noised signal or to form the de-noised signal with those two pairs of noise and normalizing differences directly.

As one skilled in the art would readily recognize, the sequence among the SAM1 to SAM4 signals in FIG. 17A to FIG. 17E may be modified to suit the fourth embodiment by replacing the SAM3 signal with the SAM1 signal and replacing the SAM4 signal with the SAM2 signal. For example, to implement the second noise and normalizing methods on the fourth embodiment as described above, one can modify FIG. 17B into FIG. 17L by replacing SAM3 and SAM4 samplings with SAM1 and SAM2 samplings, as shown in FIG. 17L. After every consecutive pair of SAM1 and SAM2 samplings, the light reader 16 outputs the corresponding noise or normalizing difference, then proceeds to the next pair.

As another example, to implement the first noise and normalizing methods on the fourth embodiment, one can modify FIG. 17B into FIG. 17J by adding a third reference level to apply onto the sense node 111 immediately after step 304 and change SAM3 to sample during this third reference level and store a sampled third reference output signal instead of sampling during the first reference level in step 300, then modify further to FIG. 17K by replacing SAM3 and SAM4 samplings with another pair of SAM1 and SAM2 samplings. Likewise, for the samplings after light exposure, a fourth reference level may be applied onto the sense node 111 before the second sense-node reset in step 310 and SAM3 sampling moved from step 314 to sample the fourth reference output signal at this time to store a sampled fourth reference output signal. Likewise, a further change from FIG. 17J into FIG. 17K replaces SAM3 and SAM4 samplings with another pair of SAM1 and SAM2 samplings. The timing of the control signals are changed from timing diagram of FIG. 16 of the first embodiment and the logic circuits are changed from the schematics of FIG. 18A to FIG. 18D, as one skilled in the art would readily know to perform.

As yet another example, to implement the third noise and normalizing methods on the fourth embodiment, one can modify FIG. 17C to FIG. 17M by bringing the first reference level to apply onto the sense node 111 immediately after the first sense-node reset, keeping SAM1 to sample during this first reference level, then replace the SAM3 and SAM4 samplings with another pair of SAM1 and SAM2 samplings. Likewise, for the samplings after light exposure, the second reference level may be brought to apply onto the sense node 111 before the second sense-node reset, keeping SAM1 to sample this second reference level, then the SAM3 and SAM4 samplings replaced with another pair of SAM1 and SAM2 samplings. Node that the SAM4 sampling may be replaced with SAM1 sampling, while the SAM3 sampling with SAM2 sampling. The timing of the control signals may be changed from the timing diagram of FIG. 16 of the first embodiment and the logic circuits may be changed from the schematics of FIG. 18A to FIG. 18D, as one skilled in the art would readily know how to. It is noted that here the second reference level also takes the role of the second springboard level. However, as one skilled in the art can readily recognize, a second springboard level different from the second reference level may be provided on the IN line 120 and driven onto the sense node 111 across the reset switch 112 between the second reference level and the second sense-node reset to adjust the second sense-node reset level and concomitantly the light response level.

The fourth embodiment may be modified to store a noise/normalizing difference signal output by the amplifier 180 on a capacitor as an analog signal, then to subsequently subtract between this analog signal and the next noise/normalizing difference signal output by the amplifier 180, the ADC 24 digitizing a result from the subtraction.

Fifth Embodiment

FIG. 24 illustrates a fifth embodiment. In the fifth embodiment, the analog gain circuits 21 and the analog subtractor 17 of the first embodiment in FIG. 1 are replaced with an analog multiplexer 23 that has an output coupled to the ADC 24. Light reader output signals 19a, 19b each transmits a noise or normalizing difference that is multiplexed by the analog multiplexer 23 to be digitized by the ADC 24. The digitized noise and normalizing differences may be combined according to any of the first to fourth noise and normalizing methods either on the image sensor 11' by a computing circuit (not shown) or on the external processor 72.

Alternately, two (or more) ADCs may be used, each ADC digitizing outputs of light readers 16, 16', respectively.

Sixth Embodiment

In a sixth embodiment (not shown in drawing), each of the first reference output signal, the first sense-node reset output signal, the common-reset output signal, the second reference output signal, the second sense-node reset output signal, and the light response output signal may be sampled and digitized directly by one or more ADCs, sequentially or concurrently, then subsequently combined arithmetically in the digital domain, either on the image sensor by a computing circuit (not shown) or externally on the processor 72, according to any one of the noise methods and/or normalizing methods, or even to form the result of the normalizing difference subtracting the noise signal, each under a respective gain, without forming one or both of the noise and normalizing differences.

Other Alternate Embodiments and Operations

Other alternate embodiments of the image sensor are possible. For example, the ADC(s) in each of the first to sixth embodiments may be located outside of the image sensor, for example on a different semiconductor substrate than a semiconductor substrate that supports the image sensor. The light readers 16, 16', 16", the analog gain circuits 17, and the analog subtractor 21 may likewise be located outside the image sensor.

Other alternate modes of operations are possible. A first variation is that the second reference level may have an offset (hereinafter "reference offset") down from a voltage level that is transmitted on the IN line immediately before the reset switch 112 switches from a triode region to an OFF state for the common reset (hereinafter "first springboard level") (e.g. in FIG. 17A the first springboard level is also the first reference level). By way of example, as shown in FIG. 17F, the second reference level may be at the VPH2 level, selected by switching DIN(1:0) to "01", whereas the first reference level takes the VPH0 level, selected by switching DIN(1:0) to "11". The reference offset may be in a same direction and by a similar amount as the common reset level is offset from the first springboard level (which is also the first reference level), for example within 50 mV of the common reset level. Having a nonzero reference offset has a benefit of minimizing a DC offset in the light response output signal, as such DC offset under high gain can saturate the amplifier 180 in the light reader. The reference offset may be chosen to be between 50 mV to 300 mV, preferably 150 mV. A separate DC offset in the noise signal due to a difference between the first and second reference levels may be reduced subsequently in the digital domain within the combiner 50 or in the external processor 72. Alternately, the separate DC offset in the noise signal may be removed in the analog domain prior to digitizing by the ADC 24 by any one of the analog DC signal subtraction methods and circuits known in the art.

Still other variations are possible, as described below.

In a second variation, the IN line 120 is driven to a higher first springboard level than the first reference level. By way of example, FIG. 17H shows a higher first springboard level after the first reference output signal is sampled in step 300 and before step 302. By way of example, the first springboard level may be provided by switching DIN(1:0) to "11" to select the VPH0 level, whereas the first reference level by switching DIN(1:0) to "10" to select the VPH1 level. The offset of the first springboard level above the first reference level (hereinafter "first springboard offset") can in part cancel the storage-node and sense-node voltage drop during the common reset in step 302, so that an offset between the first reference level and the common reset level (hereinafter "reset offset"), and concomitantly a DC offset in the noise signal, is reduced. The first springboard offset may be between 50 mV to 300 mV, preferably 150 mV. In this method, the second reference level may be same as the first reference level, since the storage node reset level is brought essentially close to the first reference level, such as within 100 mV, so that a DC offset in the normalized light response signal is likewise reduced when the second reference level is select to be equal to the first reference level.

In a third variation, the virtual ground GND1 signal 156 in the light reader that connects to the capacitors 152 to 154 has a voltage that varies between a first GND1 level when the first reference output signal is sampled and a second GND1 level when the common-reset output signal is sampled, a difference (hereinafter "GND1 step") between 50 mV and 300 mV, preferably 150 mV. By way of example, FIG. 17I shows voltage level changes on the storage node and the GND1 signal 156. The second GND1 level is offset in a same direction as the common reset level is offset from the first reference level, which is also the first springboard level in this example. The GND1 signal 156 takes the second GND1 level during the sampling of the common reset output signal, the first and second sense-node reset output signals and the light response output signal, whereas during samplings of the first and second reference output signals it takes the first GND1 level. The GND1 step thus partially cancels a DC offset between the common reset level and the first reference level and, concomitantly also a DC offset between the light response level and the second reference level. The second reference level may be same as the first reference level, for example the VPH1 level selected by DIN(1:0)="10". An analog signal driver for the GND1 signal 156 may have two or more output levels, selectable by a digital input, similar to that for the IN line driver 17, and may be controlled by a logic circuit constructed according to a similar technique of construction like the logic circuit for generating the DIN(1:0) signals.

The third variation essentially uses a technique of analog offset cancellation or DC subtraction in the light reader. Different alternatives on this technique are possible, as is known in the art. In one alternative, instead of varying the GND1 signal 156, a pair of offset-cancelling capacitors (not shown) may be connected to the "+" and "−" inputs of the amplifier 180 to perform the offset cancellation. These offset-cancelling capacitors can be charged to given voltages, their capacitances may be same as the sampling capacitors 152, 154 or different. When a sampling circuit 150, 150' or 150" of the light reader is connected to the amplifier 180 to transfer charges, the offset-cancelling capacitors are also charged to the given voltages then connected to transfer charges to the feedback capacitors 190 to effect the offset cancellation.

Another alternative on this technique is to precharge the feedback capacitors 190 to a suitable differential voltage (hereinafter "precharge voltage") prior to each transfer of charges from a sampling circuit 150, 150' or 150". The precharge voltage has an opposite direction than the reset offset in the sense that the precharge voltage partially cancels an output change of the amplifier 180 that arises due to the reset offset. The precharge voltage may be increased in magnitude for an increase in a gain of the amplifier 270 (i.e. the amplifier 180 together with the feedback capacitors 190) when the feedback capacitors 190 take a smaller capacitance value.

In a fourth variation, the second reference level is provided on the IN line 120 and the corresponding second reference output signal sampled not after the light response output signal is sampled but before the switching OFF of the reset switch 112 in step 310 that precedes the second sense-node reset output signal. By way of example, FIG. 17G shows the corresponding sense-node and storage node voltage levels. A step 309 is inserted immediately before the step 310 of the flowchart. In step 309, the reset switch 112 is in a triode region, the transfer switch 117 is in an OFF state, and the IN line 120 is driven to the second reference level. The corresponding second reference output signal on the OUT line 124 is sampled by a SAM1 signal and stored as the sampled second reference output signal. Although FIG. 17G shows a separate second springboard level is driven onto the sense node 111 between the second reference level and the sense-node reset, one skilled in the art can recognize that the second springboard level may take a same voltage level as the second reference level or different.

Various combinations and permutations of the above embodiments, variations and techniques are possible, as one skilled in the art would readily be enabled to perform. Each combination and permutation has a corresponding timing diagram and logic circuit for the global control signals that can be constructed by modifications from the timing diagram FIG. 16 and logic circuit schematic FIG. 18A to FIG. 18D, described below, as one skilled in the art would be able to readily perform.

Generating Control Signals

The various global control signals RST, SEL, TF, DIN(1), DIN(0), SAM1, SAM2, SAM3, SAM4 and SUB can be generated in a circuit generally referred to as the row decoder 20. FIG. 18A and FIG. 18B show an embodiment of logic to generate the DIN(1), DIN(0), SEL, TF, SAM1, SAM2, SAM3, SAM4 and RST signals in accordance with the timing diagram of FIG. 16. The logic may include a plurality of comparators 350 with one input connected to a counter 352 and another input connected to hardwired signals that contain a lower count value and an upper count value. The counter 352 sequentially generates a count. The comparators 350 compare the present count with the lower and upper count values. If the present count is between the lower and upper count values the comparators 350 output a logical 1. The lower and upper count values for each of the control signals may be modified to support different timings than displayed in FIG. 16, as one skilled in the art would readily recognize. For example, to support the timing sequence of SAM1, SAM2, SAM3 and SAM4 signals shown in FIG. 17B, which differs from FIG. 17A in that the SAM3 signal samples together with the SAM1 signal instead of with the SAM2 signal, the logic circuit in FIG. 18C may be modified such that the buffer that drives the SAM3 signal inputs from the SAM1 signal instead of the SAM2 signal.

The comparators 350 are connected to a plurality of OR gates 358. The OR gates 358 are connected to latches 360. The latches 360 provide the corresponding DIN(1), DIN(0), SEL, TF, SAM1, SAM2, SAM3, SAM4 and RST signals.

The latches 360 switch between a logic 0 and a logic 1 in accordance with the logic established by the OR gates 358, comparators 350 and the present count of the counter 352. For example, the hardwired signals for the comparator coupled to the DIN(1) latch may contain a count value of 1 and a count value of 22. If the count from the counter is greater or equal to 1 but less than 22 the comparator 350 will provide a logic 1 that will cause the DIN(1) latch 360 to output a logic 1. The lower and upper count values establish the sequence and duration of the pulses shown in FIG. 16.

The sensor 10, 10', 10", 11, 11' may have a plurality of reset RST(n) and transfer TF(n) drivers 374, each driver 374 being connected to a row of pixels and is connected to the output of an AND gate 375. FIG. 19 shows a unit of row decoder's output circuit between a row of pixels and a circuit shown in FIG. 18A-18D. FIG. 20 illustrates an operation of the circuit of FIG. 19. Signals RSTEN(n), SELEN(n), TFEN(n) are generated by the row decoder 20 and each may take a logic value of '1' or '0' at any one time. A '1' enables the corresponding RST(n), SEL(n), TF(n) signal to transmit a pulse signal received from global control signals RST, SEL and TF, respectively. In addition, at rising edges of the IN signal, the RST(n) and TF(n) signals are each capacitively coupled to a higher voltage level, as shown in FIG. 20, after tri-state buffer 374 drives RST(n) and TF(n), respectively, to a high level then into a tri-state.

Theory of Operation

Below, a noise cancelling effect afforded by the image sensors 10, 10', 10", 11, 11' that operate under the first noise method and the first normalizing method is explained in reference to the sampling sequence shown in FIG. 17A. The second to fourth noise and normalizing methods are subsequently shown to be equivalent to the first noise and normalizing methods, respectively.

Let $\Delta_n Q_B$ designate the temporal noise charge on the common node between the storage node 115, the sense node 111 and the channel of the transfer switch 117 at step 302, $\Delta_n Q_{C2}$ designate the temporal noise charge on the sense node at step 304, and $\Delta_n Q_{C1}$ designate the temporal noise charge on the storage node at step 304. These are temporal noise charges that affect the first image (i.e. noise signal).

Let $\Delta_n Q_{D1}$ designate the temporal noise charge on the storage node 115 at step 310, $\Delta_n Q_{D2}$ designate the temporal noise charge on the sense node 111 at step 310, and $\Delta_n Q_E$ designate the temporal noise charge on the common node between the storage node 115, the sense node 111 and the channel of the transfer switch 117 at step 312. These are temporal noise charges that affect the second image (i.e. normalized light response signal).

In the first image, temporal noise charges are related as such: $\Delta_n Q_B - \Delta_n Q_{C2} = \Delta_n Q_{C1}$, due to conservation of charges. In the second image, temporal noise charges are related as such: $\Delta_n Q_{C1} + \Delta_n Q_{D2} = \Delta_n Q_E$, due to conservation of charges. Substituting for $\Delta_n Q_{C1}$ from both relations, $$\Delta_n Q_E - \Delta_n Q_{D2} - \Delta_n Q_V + \Delta_n Q_{C2} = 0.$$

Temporal noise charges $\Delta_n Q_E$, $\Delta_n Q_{D2}$, $\Delta_n Q_B$ and $\Delta_n Q_{C2}$ result in temporal noise voltages $\Delta_A V_{GE}$, $\Delta_A V_{GD2}$, $\Delta_n V_{AB}$ and $\Delta_A V_{AC2}$, respectively, related to the temporal noise charges by $-\Delta_n Q_E = C_{Total} \cdot \Delta_n V_{GE}$, $-\Delta_n Q_{D2} = C_{Sense} \cdot \Delta_n V_{GD2}$, $-\Delta_n Q_B = C_{Total} \cdot \Delta_n V_{AB}$, and $-\Delta_n Q_{C2} = C_{Sense} \cdot \Delta_n V_{AC2}$, respectively. $C_{Sense}$ is the capacitance on the sense node 111. $C_{Total}$ is the total capacitance on the storage node 115, the sense node 111, and the channel-to-gate, drain-to-gate and source-to-gate capacitances of the transfer switch 117. Here, $V_{GE} = V_G - V_E$, $V_{GD2} = V_G - V_{D2}$, $V_{AB} = V_A - V_B$, and $V_{AC2} = V_A - V_{C2}$.

Under the first noise and normalizing methods, form $V_{AB}$ & $V_{AC2}$, being the first and second noise differences, respectively, and $V_{GE}$ & $V_{GD2}$, being the first and second normalizing differences, respectively. The third image (i.e. de-noised signal), $I_3 = I_2 - I_1 = [C_{Total} \cdot V_{GE} - C_{Sense} \cdot V_{GD2}] - [C_{Total} \cdot V_{AB} - C_{Sense} \cdot V_{AC2}]$, where $I_1 = C_{Total} \cdot V_{AB} - C_{Sense} \cdot V_{AC2}$ and $I_2 = C_{Total} \cdot V_{GE} - C_{Sense} \cdot V_{GD2}$. The temporal noise $\Delta_n I_3 = [C_{Total} \cdot \Delta_n V_{GE} - C_{Sense} \cdot \Delta_n V_{GD2}] - [C_{Total} \cdot \Delta_n V_{AB} - C_{Sense} \cdot \Delta_n V_{AC2}] = -(\Delta_n Q_E - \Delta_n Q_{D2} - \Delta_n Q_B + \Delta_n Q_{C2}) = 0$. In $I_3$, $C_{Total} \cdot V_{GE}$ is the only term that varies with exposure to light. Hence $I_3$ is dependent on $V_{GE}$ and contains no temporal switch noises that arise due to switching of reset and transfer transistors.

Equivalently, under the second noise and normalizing methods, form $V_{AB}$ & $V_{BC2}$, being the first and third noise differences, respectively, and $V_{GE}$ & $V_{ED2}$, being the first and third normalizing differences, respectively. Here, $V_{BC2} = V_B - V_{C2}$ and $V_{ED2} = V_E - V_{D2}$. Third image, $$I_3 = [C_{Total} \cdot V_{GE} - C_{Sense} \cdot V_{GE} - C_{Sense} \cdot V_{GD2} + C_{Sense} \cdot V_{GE}] - [C_{Total} \cdot V_{AB} - C_{Sense} \cdot V_{AB} - C_{Sense} \cdot V_{AC2} + C_{Sense} \cdot V_{AB}] = [(C_{Total} - C_{Sense}) \cdot V_{GE} -$$

$$C_{Sense} \cdot (V_{GD2} - V_{GE})] - [(C_{Total} - C_{Sense}) \cdot V_{AB} - C_{Sense} \cdot (V_{AC2} - V_{AB})] = [(C_{Total} - C_{Sense}) \cdot V_{GE} - C_{Sense} \cdot V_{ED2}] - [(C_{Total} - C_{Sense}) \cdot V_{AB} - C_{Sense} \cdot V_{BC2}]$$
$$= I_2 - I_1.$$

Here, $$I_1 = [(C_{Total} - C_{Sense}) \cdot V_{AB} - C_{Sense} \cdot V_{BC2}]$$

and $$I_2 = [(C_{Total} - C_{Sense}) \cdot V_{GE} - C_{Sense} \cdot V_{ED2}].$$

Equivalently, under the third noise and normalizing methods, form $V_{BC2}$ & $V_{AC2}$, being the third and second noise differences, respectively, and $V_{ED2}$ & $V_{GD2}$, being the third and second normalizing differences, respectively. Substituting for $V_{GE} = V_{GD2} - V_{ED2}$, $$I_2 = C_{Total} \cdot V_{GE} - C_{Sense} \cdot V_{GD2} = (C_{Total} - C_{Sense}) \cdot V_{GD2} - C_{Total} \cdot V_{ED2}.$$

Only the second term in $I_2$ depends on exposure to light. Substituting for $V_{AB} = V_{AC2} - V_{BC2}$, $$I_1 = (C_{Total} - C_{Sense}) \cdot V_{AC2} - C_{Total} \cdot V_{BC2}.$$

The third image, $I_3 = I_2 - I_1 = [(C_{Total} - C_{Sense}) \cdot V_{GD2} - C_{Total} \cdot V_{ED2}] - [(C_{Total} - C_{Sense}) \cdot V_{AC2} - C_{Total} \cdot V_{BC2}].$ Calibration Calibration may be performed to find a suitable set of signed scaling factors for the noise and normalizing methods chosen, for example, signed scaling factors COEF1, COEF2 in FIG. 1 or FIG. 21, or the first and second capacitances of the triple-sampling circuit 150" for the triple-sampling light reader 16" of the image sensor 10" of FIG. 22, or equivalent thereof for the other embodiments. Below describes a calibration procedure to find a suitable set of signed scaling factors.

For each pixel among a plurality of pixels that share a layout and orientation, form a difference between a pair of de-noised signals, each de-noised signal arising from forming a noise signal followed by a normalized light response signal then subtracting the noise signal from the normalized light response signal. The difference has a residual temporal noise but none of the mean of the de-noised signal. Form squares of the differences across the plurality of pixels and a sum of the squares. Since residual temporal noises of different pixels are independent, the sum of the squares is a good approximation of a multiple of a variance of the residual noise of each pixel, namely $2N\sigma^2$, where N is the number of pixels and $\sigma^2$ is the variance.

For the plurality of pixels, find the sum of the squares for each of two different sets of signed scaling factors. Normalized each sum by dividing it by a square of a number that is directly proportional to a de-noised signal that would result under the corresponding set of signed scaling factors given a predetermined exposure duration and illumination of the pixels. The set that gives a lesser normalized sum of the squares is preferred. This procedure may be performed for more than two sets of signed scaling factors to identify a suitable set of signed scaling factors to use to form the de-noised signal for the plurality of pixels.

By way of example, FIG. 10 shows a layout arrangement of pixels of two different layout orientations in an array. In odd columns, the photodiodes and transfer switches assume one orientation whereas in even columns they assume a different orientation. Due to the asymmetry between these two different groups of pixels, a systematic mismatch tends to exist in capacitances and other electrical characteristics between the groups. Within each group, on the other hand, the likeness among pixels helps to minimize mismatches. Therefore calibration should be performed to produce a set of signed scaling factors suitable for each group, and each group may use the set that is suitable for itself in the noise and normalizing methods.

FIG. 11 shows another example of layout arrangement of pixels of two different layout orientations in an array. FIG. 11 corresponds to a three-by-two array of the photodiodes 100a, 100b and transfer switches 117a, 117b corresponding to the schematic of FIG. 12 where two photodiodes 100a, 100b share a sense node 111 through transfer switches 117a, 117b, respectively. Each pixel comprises a photodiode 100a or 100b and a transfer switch 117a or 117b, and two pixels share a reset switch 112, an output transistor 116 and a select switch 114. In odd rows, the photodiodes and transfer switches assume one orientation whereas in the even rows they assume a different orientation. For the same reason as above, a calibration may be performed to produce a set of signed scaling factors suitable for each group, and each group may use the set that is suitable for itself in the noise and normalizing methods.

Alternately, from the same pixel, more than two de-noise signals may be formed, a plurality of pairs among the de-noised signals are differenced and squared, the squares summed together to form a sum-of-squares. Such sums-of-squares across a plurality of similar pixels may be further summed together to form a final-sum-of-squares. This procedure is illustrated in FIG. 25 and FIG. 26. Referring to FIG. 26, each q designates a different set of signed scaling factors, each p designates a different group of similar pixels, there being Z different sets of signed scaling factors and P different pixel layouts. For each combination of p and q, the process illustrated by the flowchart of FIG. 25 is executed. In the flowchart of FIG. 25, N+1 de-noised signals are formed for each pixel in the pixel group p. Each successive pair of de-noised signals from each pixel in the group are differenced and squared. The N squares are summed, and may be further summed across the pixels within the group.

Below describes an alternate procedure.

To compare two different sets of signed scaling factors, repeatedly capture first and second images, with the image sensor kept in the dark or under a sufficiently dim lighting such that exposure to light either causes negligible light response output signal compared with a reset noise from a pixel 14 in the pixel array 12 or causes a negligible change in the light response output signal, for due to a shot noise, compared with the reset noise. For each of one or more pixels, form a de-noised signal from each pair of a number of pairs of first and second images, preferably 9 or more pairs. Normalize each de-noised signal by dividing by a number that is directly proportional to a de-noised signal that is free of DC offset that would result under the same set of signed scaling factors if given a predetermined non-negligible illumination of the pixel(s). Find a variance among the normalized de-noised signals. The set of signed scaling factors that gives a lesser variance is preferred. This procedure may be repeated for more than two sets of signed scaling factors to find a set of signed scaling factors suitable for forming a de-noised signal.

The image sensor may have a circuit to control repeated captures of first and second images and adjustments of the signed scaling factors applied in the noise and normalizing methods. Alternately, the signed scaling factors may be adjusted under a control from an external controller (not shown) or computer (not shown).

Any of these calibration procedures may be completely performed on the image sensor, or partially on the image sensor and partially on the external processor. Alternately, a part of this procedure may be performed on a separate computer and/or under a control of the separate computer.

A data that corresponds to a set of gain factors may be written into a nonvolatile memory or as a configuration of fuses or antifuses in the image sensor or a separate device that is or is to be included in the image capture system, for example the external processor 72 or a memory card such as commonly known flash memory cards.

CLOSING

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

For example, although interleaving techniques involving entire lines of an image are shown and described, it is to be understood that the data may be interleaved in a manner that involves less than a full line, or more than one line. By way of example, one-half of the first line of image A may be transferred, followed by one-half of the first line of image B, followed by the second-half of the first line of image A, and so forth and so on. Likewise, the first two lines of image A may be transferred, followed by the first two lines of image B, followed by the third and fourth lines of image A, and so forth and so on.

The invention claimed is:

1. An image sensor, comprising:
    a photodetector;
    an output transistor having a gate coupled to receive a signal from said photodetector;
    a reset transistor having a source terminal coupled to reset said photodetector;
    a sample circuit coupled to receive an output signal from said output transistor, said sample circuit including a first capacitor that has a first terminal and a second terminal and a second capacitor that has a third terminal and a fourth terminal, the first and third terminals being respectively connected to receive output signals from said output transistor; and
    a control circuit having:
        a first configuration to switch said reset transistor to a triode region such that said output transistor provides a first output signal to the first terminal to be sampled while said reset transistor is in the triode region; and
        a second configuration to switch said reset transistor to an OFF state such that said output transistor provides a second output signal to the third terminal to be sampled during the OFF state,
    wherein said control circuit selects a first voltage level for the second terminal to sample the first output signal and selects a second voltage level for the fourth terminal to sample the second output signal,
    wherein the second voltage level is offset from the first voltage level in a direction same as the first output signal is offset from the second output signal.

2. An image sensor, comprising:
    a photodetector;
    an output transistor having a gate coupled to receive a signal from said photodetector;
    a reset transistor having a source terminal coupled to reset said photodetector;
    a sample circuit coupled to receive an output signal from said output transistor, said sample circuit including a first capacitor that has a first terminal and a second terminal and a second capacitor that has a third terminal and a fourth terminal, the first and third terminals being respectively connected to receive output signals from said output transistor; and
    a control circuit having:
        a first configuration to switch said reset transistor to a triode region such that said output transistor provides a first output signal to the first terminal to be sampled while said reset transistor is in the triode region; and
        a second configuration to switch said reset transistor to an OFF state such that said output transistor provides a second output signal to the third terminal to be sampled during the OFF state,
    wherein immediately before said reset transistor switches to said OFF state said reset transistor is in another triode region but is biased differently than in the first configuration such that said output transistor outputs a third output signal,
    wherein both the first and second output signals are offset in a same direction from the third output signal.

* * * * *